(12) United States Patent
Chall et al.

(10) Patent No.: US 8,675,371 B2
(45) Date of Patent: *Mar. 18, 2014

(54) DISTRIBUTED COMPUTING

(75) Inventors: Louis Edmund Chall, Costa Mesa, CA (US); John Bradley Serson, Irvine, CA (US); Philip Arnold Roberts, Clayton, OH (US); Cecil Eugene Hutchins, Costa Mesa, CA (US)

(73) Assignee: Advanced Processor Architectures, LLC, Costa Mesa, CA (US)

( * ) Notice: Subject to any disclaimer, the term of this patent is extended or adjusted under 35 U.S.C. 154(b) by 166 days.

This patent is subject to a terminal disclaimer.

(21) Appl. No.: 12/852,423

(22) Filed: Aug. 6, 2010

(65) Prior Publication Data

US 2011/0032688 A1 Feb. 10, 2011

Related U.S. Application Data

(60) Provisional application No. 61/232,353, filed on Aug. 7, 2009.

(51) Int. Cl.
*H05K 1/11* (2006.01)
*H01L 23/04* (2006.01)

(52) U.S. Cl.
CPC .................................. *H01L 23/041* (2013.01)
USPC .......................................... 361/803; 361/784

(58) Field of Classification Search
CPC ............................. H01L 23/041; H01L 25/18
USPC .................... 361/803, 784, 760, 764
See application file for complete search history.

(56) References Cited

U.S. PATENT DOCUMENTS

| | | | |
|---|---|---|---|
| 3,611,317 A | 10/1971 | Bonfeld |
| 3,623,127 A | 11/1971 | Glenn |
| 3,698,082 A | 10/1972 | Hyltin et al. |
| 3,715,629 A | 2/1973 | Swengel, Sr. |
| 3,716,759 A | 2/1973 | Scace et al. |
| 4,107,760 A | 8/1978 | Zimmer |
| 4,214,292 A | 7/1980 | Johnson |
| 4,246,597 A | 1/1981 | Cole et al. |
| 4,254,446 A | 3/1981 | Peoples |
| 4,296,456 A | 10/1981 | Reid |
| 4,321,654 A | 3/1982 | Nakajo et al. |

(Continued)

OTHER PUBLICATIONS

International Search Report and Written Opinion dated Dec. 2, 2010, PCT Application No. US2010/044800.

(Continued)

*Primary Examiner* — Yuriy Semenenko
(74) *Attorney, Agent, or Firm* — Knobbe, Martens, Olson & Bear, LLP

(57) ABSTRACT

On a typical motherboard the processor and memory are separated by a printed circuit data bus that traverses the motherboard. Throughput, or data transfer rate, on the data bus is much lower than the rate at which a modern processor can operate. The difference between the data bus throughput and the processor speed significantly limits the effective processing speed of the computer when the processor is required to process large amounts of data stored in the memory. The processor is forced to wait for data to be transferred to or from the memory, leaving the processor under-utilized. The delays are compounded in a distributed computing system including a number of computers operating in parallel. The present disclosure describes systems, method and apparatus that alleviate delays so that memory access bottlenecks are not compounded within distributed computing systems.

25 Claims, 24 Drawing Sheets

(56) References Cited

U.S. PATENT DOCUMENTS

| | | | |
|---|---|---|---|
| 4,337,499 A | 6/1982 | Cronin et al. |
| 4,398,208 A | 8/1983 | Murano et al. |
| 4,437,141 A | 3/1984 | Prokop |
| 4,484,215 A | 11/1984 | Pappas |
| 4,489,363 A | 12/1984 | Goldberg |
| 4,519,078 A | 5/1985 | Komonytsky |
| 4,549,200 A | 10/1985 | Ecker et al. |
| 4,551,746 A | 11/1985 | Gilbert et al. |
| 4,551,747 A | 11/1985 | Gilbert et al. |
| 4,564,900 A | 1/1986 | Smitt |
| 4,578,697 A | 3/1986 | Takemae |
| 4,582,953 A | 4/1986 | Nagase et al. |
| 4,594,711 A | 6/1986 | Thatte |
| 4,600,970 A | 7/1986 | Bauer |
| 4,635,093 A | 1/1987 | Ross |
| 4,638,348 A | 1/1987 | Brown et al. |
| 4,679,121 A | 7/1987 | Schomers et al. |
| 4,685,032 A | 8/1987 | Blomstedt et al. |
| 4,687,697 A | 8/1987 | Cambou et al. |
| 4,697,204 A | 9/1987 | Mita et al. |
| 4,701,916 A | 10/1987 | Naven et al. |
| 4,704,599 A | 11/1987 | Kimmel et al. |
| 4,754,316 A | 6/1988 | Reid |
| 4,755,866 A | 7/1988 | Marshall et al. |
| 4,770,640 A | 9/1988 | Walter |
| 4,771,366 A | 9/1988 | Blake et al. |
| 4,779,273 A | 10/1988 | Beucler et al. |
| 4,817,093 A | 3/1989 | Jacobs et al. |
| 4,858,072 A | 8/1989 | Chall, Jr. |
| 4,918,335 A | 4/1990 | Chall, Jr. |
| 4,918,691 A | 4/1990 | Chall, Jr. |
| 4,937,658 A | 6/1990 | Chall, Jr. |
| 4,937,659 A | 6/1990 | Chall, Jr. |
| 4,955,131 A * | 9/1990 | Chall, Jr. ................. 29/830 |
| 5,166,674 A | 11/1992 | Baum et al. |
| 5,261,105 A | 11/1993 | Potter et al. |
| 5,396,613 A | 3/1995 | Hollaar |
| 5,677,849 A | 10/1997 | Smith |
| 5,786,979 A | 7/1998 | Douglass |
| 5,903,559 A | 5/1999 | Acharya et al. |
| 5,933,435 A | 8/1999 | Shah et al. |
| 6,133,634 A | 10/2000 | Joshi |
| 6,219,559 B1 | 4/2001 | Hill et al. |
| 6,353,616 B1 | 3/2002 | Elwalid et al. |
| 6,388,333 B1 | 5/2002 | Taniguchi et al. |
| 6,539,027 B1 | 3/2003 | Cambron |
| 6,556,582 B1 | 4/2003 | Redi |
| 6,625,740 B1 | 9/2003 | Datar et al. |
| 7,020,145 B1 | 3/2006 | Symons et al. |
| 7,033,857 B2 | 4/2006 | Munakata et al. |
| 7,076,716 B1 | 7/2006 | Hauck et al. |
| 7,171,484 B1 | 1/2007 | Krause et al. |
| 7,257,093 B1 | 8/2007 | Witzke et al. |
| 7,285,848 B2 | 10/2007 | Onodera et al. |
| 7,295,036 B1 | 11/2007 | Zaveri et al. |
| 7,335,985 B2 | 2/2008 | Murphy et al. |
| 7,336,953 B2 | 2/2008 | Kim et al. |
| 7,357,017 B2 | 4/2008 | Felton et al. |
| 7,379,959 B2 | 5/2008 | Hinni et al. |
| 7,382,747 B2 | 6/2008 | Hu et al. |
| 7,499,436 B2 | 3/2009 | Ikeda et al. |
| 7,567,100 B2 | 7/2009 | Jing |
| 7,728,383 B2 | 6/2010 | Kusumoto et al. |
| 7,777,311 B2 | 8/2010 | Utsumi et al. |
| 7,787,364 B2 | 8/2010 | Maeda et al. |
| 7,797,449 B2 | 9/2010 | Hipp et al. |
| 7,860,059 B2 | 12/2010 | Lee et al. |
| 7,864,871 B1 | 1/2011 | Hsu et al. |
| 7,934,122 B2 | 4/2011 | Candelaria et al. |
| 8,000,248 B2 | 8/2011 | Abondo |
| 8,014,285 B2 | 9/2011 | Yoon et al. |
| 8,014,380 B2 | 9/2011 | Lewis |
| 8,022,526 B2 * | 9/2011 | Chall et al. ................. 257/686 |
| 8,031,603 B1 | 10/2011 | Polk et al. |
| 8,069,365 B2 | 11/2011 | Gu |
| 8,089,905 B2 | 1/2012 | Umeshima |
| 8,381,031 B2 | 2/2013 | Chall et al. |
| 2001/0021984 A1 | 9/2001 | Kim |
| 2002/0046379 A1 | 4/2002 | Miki et al. |
| 2002/0087699 A1 | 7/2002 | Karagiannis et al. |
| 2002/0184547 A1 | 12/2002 | Francis et al. |
| 2003/0055980 A1 | 3/2003 | Liu et al. |
| 2003/0122212 A1 | 7/2003 | Herzum et al. |
| 2004/0133692 A1 | 7/2004 | Blanchet et al. |
| 2005/0002363 A1 | 1/2005 | Cheng et al. |
| 2005/0210325 A1 | 9/2005 | Douady et al. |
| 2006/0049504 A1 * | 3/2006 | Corisis et al. ................. 257/686 |
| 2006/0282739 A1 | 12/2006 | Meyer et al. |
| 2007/0070611 A1 | 3/2007 | Koh et al. |
| 2007/0083791 A1 | 4/2007 | Panesar et al. |
| 2007/0189170 A1 | 8/2007 | Pirbhai |
| 2007/0290320 A1 | 12/2007 | Onodera et al. |
| 2008/0013557 A1 | 1/2008 | Siemens et al. |
| 2008/0054488 A1 | 3/2008 | Leddige et al. |
| 2008/0195912 A1 | 8/2008 | Mende et al. |
| 2008/0197469 A1 * | 8/2008 | Yang et al. .................... 257/686 |
| 2009/0006635 A1 | 1/2009 | Siegmund |
| 2009/0037756 A1 | 2/2009 | Lundquist et al. |
| 2009/0119561 A1 | 5/2009 | Yokota et al. |
| 2009/0172191 A1 | 7/2009 | Dumitriu et al. |
| 2010/0157854 A1 | 6/2010 | Anderson et al. |
| 2010/0246478 A1 | 9/2010 | Liu et al. |
| 2010/0318661 A1 | 12/2010 | Heurguier |
| 2011/0032677 A1 | 2/2011 | Chall et al. |
| 2011/0035177 A1 | 2/2011 | Chall et al. |
| 2011/0035612 A1 | 2/2011 | Chall et al. |
| 2011/0035626 A1 | 2/2011 | Chall et al. |

OTHER PUBLICATIONS

R. R. Johnson, Discrete Wafer Scale Integration, Water Scale Integration, Proc of the IFIP WG 10.5 Workshop, 1986, pp. 345-352, Elsevier Science Publishers B.V. (North-Holland), ed by G. Sancier et al.

Lou Chall, Aeronutronic Division, Advanced Processor Technology, exponent—The Ford Aerospace Technical Journal, Winter 1989/1990, pp. 10-18, Ford Aerospace.

J. Alves Marques, Mosaic: A Modular Architecture for VLSI System Circuits, Conference: VLSI81, Very Large Scale Integration, Proceedings, Aug. 18-21, 1981, pp. 53-61.

Jerry Lyman, Silicon-on-Silicon Hybrids are Coming Into Their Own, Electronics, May 28, 1987, pp. 47-48.

C. C. Perkins Sr. et al., the Impact of Silicon Interconnect Technology on the Design Engineer, IEEE Conf. 1987, Electro /87 & Mini/Micro Northeast, No. 36/2, pp. 1-4.

Office Action dated Oct. 19, 2011, U.S. Appl. No. 12/852,381.

Office Action dated Feb. 14, 2012, U.S. Appl. No. 12/852,381.

Amendment after Allowance dated Jun. 3, 2011, U.S. Appl. No. 12/852,409, filed Aug. 6, 2010.

Notice of Allowance dated Mar. 7, 2011, U.S. Appl. No. 12/852,409, filed Aug. 6, 2010.

Notice of Allowance dated Mar. 7, 2011, U.S. Appl. No. 12/852,381, filed Aug. 6, 2010.

Office Action dated Sep. 4, 2012, U.S. Appl. No. 12/852,406, filed Aug. 6, 2010.

Office Action dated Sep. 12, 2012, U.S. Appl. No. 12/852,430, filed Aug. 6, 2010.

Response to Office Action dated Jul. 16, 2012, U.S. Appl. No. 12/852,381, filed Aug. 6, 2010.

Amendment after Non-Final Office Action dated Sep. 12, 2012, filed Feb. 12, 2013.

Response to Office Action dated Aug. 24, 2012, filed Feb. 22, 2013.

Response to Office Action dated Sep. 12, 2012, filed Mar. 11, 2013.

Notice of Allowance dated May 24, 2013, U.S. Appl. No. 12/852,430, filed Aug. 6, 2010.

Supplemental Amendment and Interview Summary filed May 24, 2013.

Notice of Allowance dated Jun. 5, 2013, U.S. Appl. No. 12/852,406, filed Aug. 6, 2010.

* cited by examiner

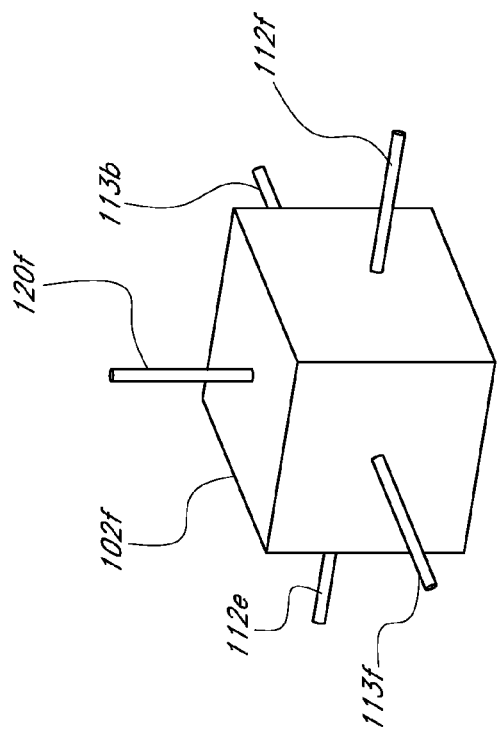
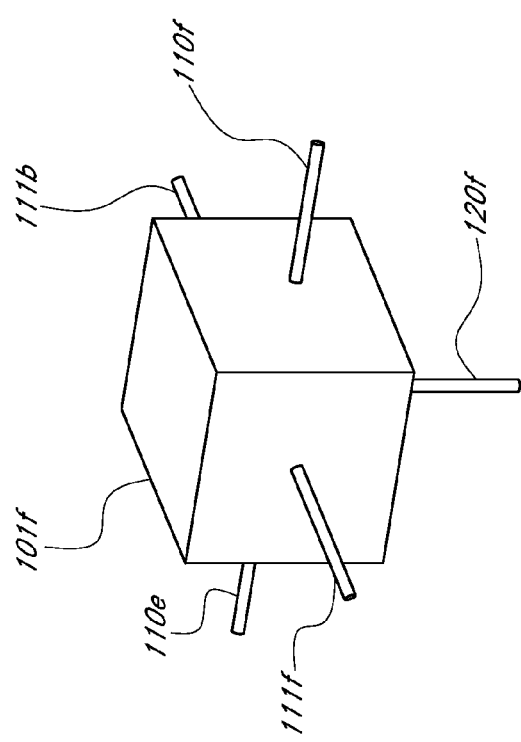
FIG. 3B
FIG. 3A

DISTRIBUTED COMPUTING

CLAIM OF PRIORITY UNDER 35 U.S.C. §119

The present application for patent claims priority to U.S. Provisional Patent Application No. 61/232,353, entitled "SYSTEM AND METHOD FOR DISTRIBUTION COMPUTING," filed Aug. 7, 2009. The above-referenced provisional patent application is hereby expressly incorporated by reference herein.

BACKGROUND

1. Field

The present application relates to distributed computing, and in particular, to systems, methods and apparatus configured to enable distributed computing.

2. Background

The architecture of a typical modern computer is based on the von Neumann architecture. The von Neumann architecture is a basic design for a stored-program digital computer that includes a processor that is separated from a memory, which is used to store computer program instructions and data. Even though typical modern computer architectures are more complex than the original von Neumann architecture, typical modern computers retain the separation between the processor and the bulk memory.

Specifically, along with a number of other components, the processor and memory are provided on a printed circuit board, referred to as a motherboard (or "main board", "system board" or "logic board"). On a typical motherboard, the processor and memory communicate via printed circuit data bus. Throughput, or data transfer rate, on the data bus is much lower than the rate at which a modern processor can operate. The difference between the data bus throughput and the processor speed significantly limits the effective processing speed of the computer when the processor is instructed to process large amounts of data stored in the memory. The processor is forced to wait for data to be transferred to or from the memory, leaving the processor under-utilized.

The performance limitation caused by separating the processor and the memory on a motherboard is referred to as the von Neumann bottleneck. The severity of the bottleneck tends to increase because over time processor speeds and memory sizes tend to increase at a faster rate than the improvements in throughput over the data bus connecting new processors to bigger memories. Previous attempts to alleviate the problem have only been partially successful. For example, previous hardware solutions that address the von Neumann bottleneck include providing a cache between the processor and the bulk memory, and/or providing separate caches with separate access paths for data and instructions; and, previous software solutions include branch predictor algorithms. However, none of the previous solutions fully address the problem.

Additionally, the performance degradations caused by the von Neumann bottleneck are exacerbated in a distributed computing environment in which computer processing of data is carried out by a number of processors operating simultaneously on smaller portions of a larger task. In a conventional distributed computing environment, such as a data center, multiple computers, each with a respective processor and memory, are coupled to one another. Typically, in an effort to reduce overhead, multiple motherboards are connected to one another within one cabinet. Each motherboard is subject to performance degradation caused by the von Neumann bottleneck even if some of the measures discussed above have been taken to alleviate the full impact of the problem. As such, delays in the processing of data caused by the respective data buses on the various motherboards are compounded, as processing service requests between processors are subject to delays on each motherboard that a service request is processed. Accordingly, there lies a challenge to alleviate delays so that memory access bottlenecks are not compounded within distributed computing systems.

SUMMARY

Various embodiments of systems, methods and devices within the scope of the appended claims each have several aspects, no single one of which is solely responsible for the desirable attributes described herein. Without limiting the scope of the appended claims, some prominent features are described herein. After considering this discussion, and particularly after reading the section entitled "Detailed Description" one will understand how the features of various embodiments are used to enable distributed and dynamically reconfigurable computing systems and devices.

One aspect of the disclosure is an apparatus including a first integrated circuit die, the first die having a surface including a first set of one or more connection pads, wherein each connection pad is configured to enable one of communication to and from the first die; a second integrated circuit die, the second die having a surface including a second set of one or more connection pads, wherein each connection pad is configured to enable one of communication to and from the second die, and wherein the surface of the second die including the second set of one or more connection pads is arranged to face the surface of the surface of the first die including the first set of one or more connection pads; and a first connector coupling at least one connection pad of the first set of one or more connection pads to one or more corresponding connection pads of the second set of one or more connection pads.

In one embodiment, the apparatus further includes a third set of one or more connection pads on the surface of the first die, wherein each connection pad is configured to enable one of communication to and from the first die; a fourth set of one or more connection pads on the surface of the second die, wherein each connection pad is configured to enable one of communication to and from the second die; and a second connector coupling at least one connection pad of the third set of one or more connection pads to one or more corresponding connection pads of the fourth set of one or more connection pads.

In one embodiment, the apparatus further includes a third integrated circuit die, the third die having a surface including a third set of one or more connection pads, wherein each connection pad is configured to enable one of communication to and from the third die, wherein the third die is adjacent the first die and disposed facing substantially the same direction as the first die; a second connector coupling at least one connection pad of the third set of one or more connection pads to one or more corresponding connection pads of the first set of one or more connection pads.

In one embodiment, the apparatus further includes a third integrated circuit die, the third die having a surface including a third set of one or more connection pads, wherein each connection pad is configured to enable one of communication to and from the third die, wherein the third die is adjacent the first die; a fourth integrated circuit die, the fourth die having a surface including a fourth set of one or more connection pads, wherein each connection pad is configured to enable one of communication to and from the fourth die, wherein the fourth die is adjacent the second die and wherein the surface of the fourth die including the fourth set of one or more connection pads is arranged to face the surface of the surface of the third die including the third set of one or more connection pads; and a second connector coupling at least one connection pad of the third set of one or more connection pads to one or more corresponding connection pads of the fourth set of one or more connection pads. In one embodiment, the apparatus further includes a fifth set of one or more connection pads on the surface of the first die, wherein each connection pad is configured to enable one of communication to and from the first die; a sixth set of one or more connection pads on the surface of the third die, wherein each connection pad is configured to enable one of communication to and from the third die; and a third connector coupling at least one connection pad of the fifth set of one or more connection pads to one or more corresponding connection pads of the sixth set of one or more connection pads. In another embodiment, the apparatus further includes a fifth set of one or more connection pads on the surface of the second die, wherein each connection pad is configured to enable one of communication to and from the second die; a sixth set of one or more connection pads on the surface of the fourth die, wherein each connection pad is configured to enable one of communication to and from the fourth die; and a third connector coupling at least one connection pad of the fifth set of one or more connection pads to one or more corresponding connection pads of the sixth set of one or more connection pads. In another embodiment, the apparatus further includes a fifth set of one or more connection pads on the surface of the first die, wherein each connection pad is configured to enable one of communication to and from the first die; a sixth set of one or more connection pads on the surface of the third die, wherein each connection pad is configured to enable one of communication to and from the third die; a seventh set of one or more connection pads on the second die, wherein each connection pad is configured to enable one of communication to and from the second die; an eighth set of one or more connection pads on the surface of the fourth die, wherein each connection pad is configured to enable one of communication to and from the fourth die; a third connector coupling at least one connection pad of the fifth set of one or more connection pads to one or more corresponding connection pads of the sixth set of one or more connection pads; and a fourth connector coupling at least one connection pad of the seventh set of one or more connection pads to one or more corresponding connection pads of the eighth set of one or more connection pads.

One aspect of the disclosure is an apparatus including a first plurality of integrated circuit chips arranged on a first plane; a second plurality of integrated circuit chips arranged on a second plane, wherein the chips of the second plurality of chips are disposed facing the corresponding chips of the first plurality of chips; and wherein at least some of the first plurality of chips are connectable to communicate with at least some of the second plurality of chips, and wherein at least some of the first plurality of chips are connectable to communicate with at least one adjacent chip in the first plurality of chips.

In one embodiment, at least some of the second plurality of chips are connectable to communicate with at least one adjacent chip in the second plurality of chips. In one embodiment, at least some of the first plurality of chips are configured to include processors. In one embodiment, at least some of the first plurality of chips include a standard external interface and a custom internal interface. In one embodiment, at least some of the second plurality of chips are configured to include memory elements.

In one embodiment at least some of the first plurality of chips are configured to be switched between an activated and deactivated state. For example, some of the first plurality of chips are configured to sense a reduction in demand for service and automatically switch to the deactivated state when the sensed demand for service crosses a threshold. In other example, some of the first plurality of chips are configured to sense an increase in demand for service and automatically switch to the activated state when the sensed demand for service crosses a threshold.

One aspect of the disclosure is an integrated circuit package including a first conductive tray having a planar inner surface and a sidewall extending from the planar inner surface, the planar inner surface configured to receive and provide an electrical ground connection to a first integrated circuit die; and a second conductive tray having a planar inner surface and a sidewall extending from the planar inner surface, the planar inner surface configured to receive and provide an electrical ground connection to a second integrated circuit die, wherein once assembled the first die and second die are disposed facing one another, and wherein the respective sidewalls of the first a second conductive trays mate so as to make contact and also provide at least one gap through which a signal lead can extend; at least one electrical ground tab connectable to at least one of the first and second conductive trays and also connectable to at least one of the first die and the second die; at least one signal tab extending through a respective gap between the respective sidewalls of the first and second conductive trays; and at least one power line enveloped by a insulator abutting the first and second conductive trays, the at least one power line including at least one contact connectable to at least one of the first die and the second die.

One aspect of the disclosure is an apparatus including a first substrate for supporting a plurality of dual-chip carriers, the first substrate having first and second sides; a plurality of dual-chip carriers disposed on the first side of the first substrate. In one embodiment, each dual-chip carrier includes a first conductive tray having a planar inner surface and a sidewall extending from the planar inner surface, the planar inner surface configured to receive and provide an electrical ground connection to a first integrated circuit die; and a second conductive tray having a planar inner surface and a sidewall extending from the planar inner surface, the planar inner surface configured to receive and provide an electrical ground connection to a second integrated circuit die, wherein once assembled the first die and second die are disposed facing one another, and wherein the respective sidewalls of the first a second conductive trays mate so as to make contact and also provide at least one gap through which a signal tab can extend; at least one electrical ground tab connectable to at least one of the first and second conductive trays and also connectable to at least one of the first die and the second die; at least one signal tab extending through a respective gap between the respective sidewalls of the first and second conductive trays; and at least one power line enveloped by a insulator abutting the first and second conductive trays, the at least one power line including at least one contact connectable to at least one of the first die and the second die.

One aspect of the disclosure is a method of reconfiguring a system including a plurality of integrated circuit chips, the method including transmitting at least one test message to a chip under test from a neighboring chip; waiting for a response from the chip under test; confirming communication in response to receiving a response from the chip under test; deeming the chip under test to be in a failed state when a response is not received before the timer crosses a first threshold; and one of ceasing to utilize the chip under test and reassigning functions previously assigned to the chip under test to an alternate chip in response to deeming the chip under test to be in a failed state.

In one embodiment the method further includes identifying one or more neighboring chips to the chip under test; and selecting a first neighbor chip to transmit the test message. In one embodiment, the method further includes determining whether or not there are any remaining alternate neighboring chips that have yet to attempt communication with the chip under test in response to a second timer crossing a second threshold; selecting an alternate neighboring chip to transmit a test message in response to determining that there are remaining alternate neighboring chips; and deeming the chip under test to be in a failed state in response to determining that there are no alternate neighboring chips that have yet to attempt communication with the chip under test. In one embodiment, the method further includes confirming communication access to the chip under test; and testing the function of the chip under test by providing at least one test vector with a known response.

One aspect of the disclosure is a method of requesting service from a remotely located integrated circuit die, the method including determining a remote service requirement; transmitting a service request to a neighboring integrated circuit die; waiting to receive a first acknowledgement message; and waiting to receive a second acknowledgement message negating the first acknowledgement message. In one embodiment, the first acknowledgement message indicates a non-acknowledgement of the service request, and the second acknowledgement indicates an acknowledgement of the service request.

In one embodiment, the method further includes determining when a first timer crosses a first threshold, wherein the first threshold provides an indication of the amount of time elapsed since the service request was transmitted without having received the first acknowledgment; determining whether or not a fault threshold has been breached in response to the first timer crossing the first threshold; transmitting the service request to an alternate neighbor in response to a breach of the fault threshold; and re-transmitting the service request in response to a non-breach of the fault threshold. In one embodiment, the method further includes receiving the first acknowledgement message; determining when the first timer crosses a second threshold, wherein the second threshold provides an indication of the amount of time elapsed since the service request was transmitted without having received the second acknowledgment; determining whether or not a fault threshold has been breached in response to the first timer crossing the second threshold; and re-transmitting the service request in response to a non-breach of the fault threshold. In one embodiment, the method further includes receiving a first response to the service message; and establishing a data tunnel to the remotely located integrated circuit die in response to receiving the first response.

One aspect of the disclosure is a method of processing a service request from a neighbor integrated circuit die, the method including receiving a service request; transmitting a first acknowledgement message in response to receiving the service request; and transmitting a second acknowledgement message in response to satisfying at least one condition. In one embodiment, the first acknowledgement message indicates a non-acknowledgement of the service request, and the second acknowledgement indicates an acknowledgement of the service request. In one embodiment, the method includes determining whether or not the service request satisfies a condition of reception.

In one embodiment, the method further includes: determining whether or not the service request can be processed locally; processing the service request in response to determining that the service request can be processed locally; and transmitting the service request to another integrated circuit die in response to determining that the service request cannot be processed locally. In one embodiment, the method further includes establishing a data tunnel to the requesting integrated circuit die; and transmitting one or more responses to the requesting integrated circuit die via the data tunnel.

One aspect of the disclosure is a method of initializing a sleep mode for an integrated circuit chip, the method including: sensing an indicator to enter sleep mode; evaluating the indicator to determine how many components to deactivate; and selectively deactivating one or more components in response to the results of the evaluation of the indicator. In one embodiment, sensing the indicator includes receiving a command to enter sleep mode. In one embodiment, sensing the indicator comprises sensing the loss of one or more input signals.

BRIEF DESCRIPTION OF THE DRAWINGS

FIG. 3A is a simplified perspective view of one integrated circuit die shown in FIG. 1.

FIG. 3B is a simplified perspective view of another integrated circuit die shown in FIG. 1 which is arranged facing the integrated circuit die shown in FIG. 3A.

Figure 1:
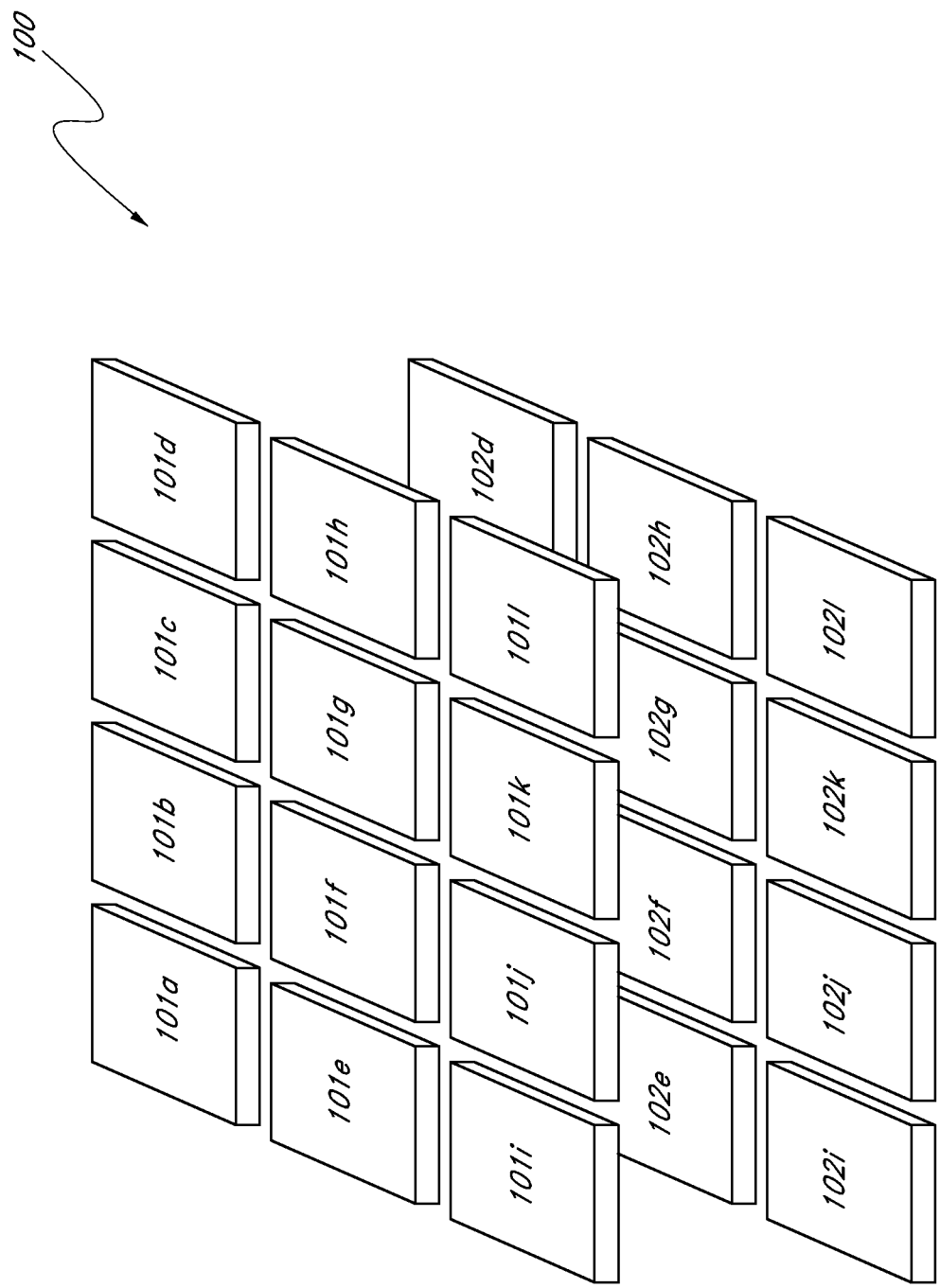
FIG. 1 is a simplified perspective view of one embodiment of a distributed computing architecture including an arrangement of a number of integrated circuit dice.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or apparatus. Finally, like reference numerals may be used to denote like features throughout the specification and figures.

DETAILED DESCRIPTION

Various aspects of embodiments within the scope of the appended claims are described below. It should be apparent that the aspects described herein may be embodied in a wide variety of forms and that any specific structure and/or function described herein is merely illustrative. Based on the present disclosure one skilled in the art should appreciate that an aspect described herein may be implemented independently of any other aspects and that two or more of these aspects may be combined in various ways. For example, an apparatus may be implemented and/or a method may be practiced using any number of the aspects set forth herein. In addition, such an apparatus may be implemented and/or such a method may be practiced using other structure and/or functionality in addition to or other than one or more of the aspects set forth herein.

FIG. 1 is a simplified perspective view of one embodiment of an architecture for a distributed computing system 100 including an arrangement of a number of integrated circuit dice. For the sake of clarity, the packaging around individual pairs of dice and connections between dice are not shown. However, those skilled in the art will appreciate from the present disclosure, and especially with reference to FIGS. 8 and 10, that in one embodiment, individual pairs of dice can be packaged within a dual-chip carrier also disclosed herein. The system 100 includes a first layer of integrated circuit dice arranged over a second layer of integrated circuit dice. As illustrated in FIG. 1, the first layer of integrated circuit dice includes, for example, twelve dice 101a, 101b, 101c, 101d, 101e, 101f, 101g, 101h, 101i, 101j, 101k, 101l, arranged in a 3×4 matrix. Similarly, the second layer of integrated circuit dice includes twelve corresponding dice 102a, 102b, 102c, 102d, 102e, 102f, 102g, 102h, 102i, 102j, 102k, 102l, arranged in a 3×4 matrix disposed facing the first layer. While FIG. 1 shows twenty-four dice arranged in two layers each having three rows and four columns, those skilled in the art will appreciate from the present disclosure that various embodiments of the architecture include any number integrated circuit dice arranged in two layers each having any number of rows and any number of columns. In particular, in one embodiment, the first and second layers include a different number of integrated circuit dice as compared to one another.

Figure 2:
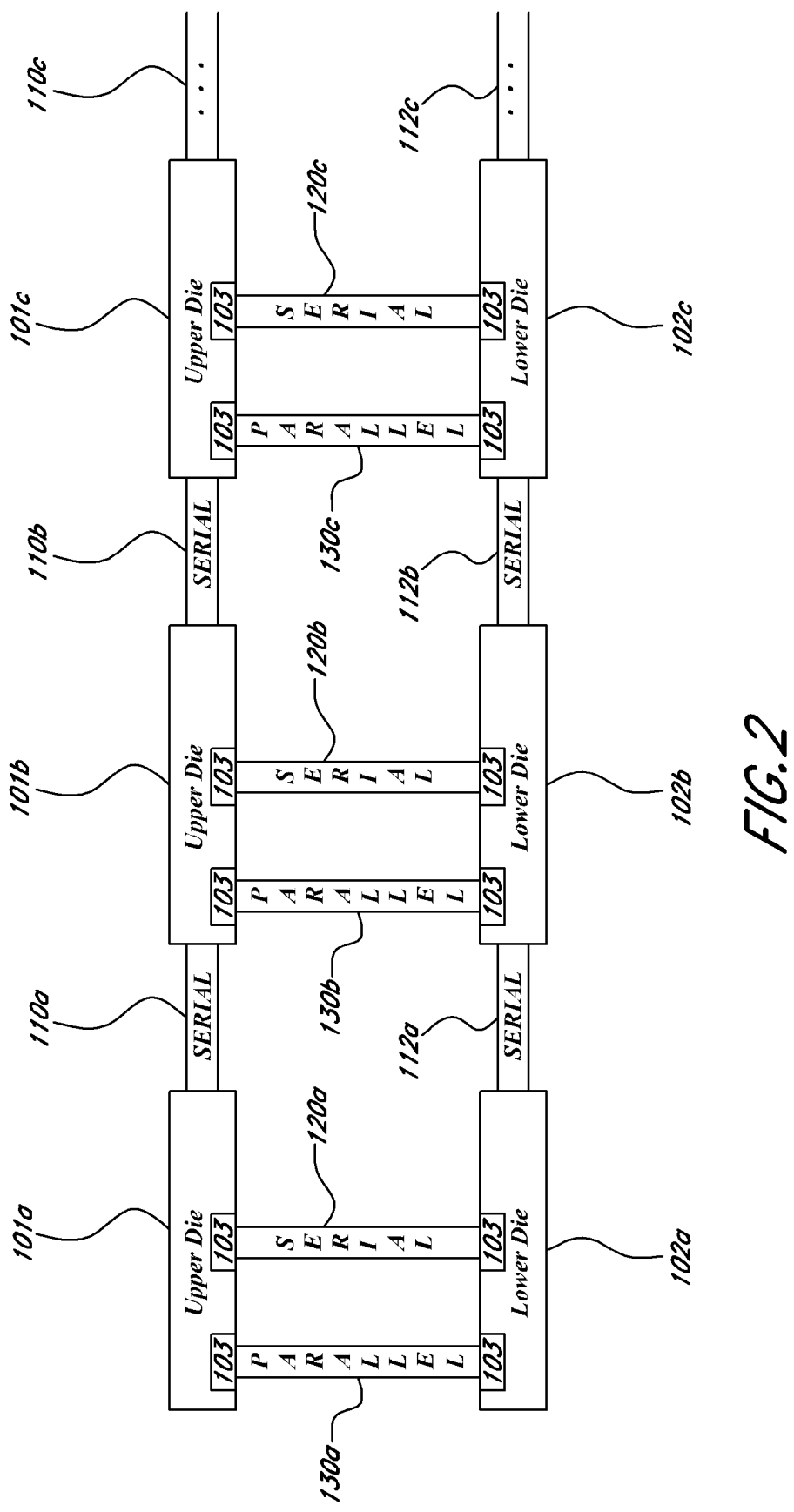
FIG. 2 is a simplified side view of one embodiment of the distributed computing architecture shown in FIG. 1.

FIG. 2 is a simplified side view of a portion of the system 100 illustrated in FIG. 1. Specifically, six of the twenty-four integrated circuit dice of FIG. 1 are illustrated in FIG. 2, including integrated circuit dice 101a, 101b, 101c included in the first layer and integrated circuit dice 102a, 102b, 102c included in the second layer and disposed facing the corresponding dice of the first layer. The portion of the system 100 illustrated in FIG. 2 also includes example data connections between the respective pairs of integrated circuit dice located on different layers. For example, die 101a and die 102a share a serial connection 120a and a parallel connection 130a. Similarly, die 101b and die 102b share a serial connection 120b and a parallel connection 130b. Similarly, die 101c and die 102c share a serial connection 120c and a parallel connection 130c. Moreover, while each pair of dice discussed above share both serial and parallel connections, alternatively, a given pair of dice can be configured to share at least one of serial connectivity, parallel connectivity or a combination there of. Moreover, the respective serial and parallel connections discussed above may be implemented via a number of forms including one or more solder balls and/or one or more wire leads. Each of the dice has a surface including a set of one or more connection pads 103. Each connection pad 103 is configured to enable one of communication to and from a die.

The portion of the system 100 illustrated in FIG. 2 also includes example data connections between the respective integrated circuit dice located on the same layer. For example, die 101a and die 101b share a serial connection 110a. Similarly, die 101b and die 101c share a serial connection 110b. Similarly, die 102a and die 102b share a serial connection 112a. Similarly, die 102b and die 102c share a serial connection 112b. Moreover, while all the data connections between dice in the same layer are shown to be serial data connections, those skilled in the art will appreciate that each connection may be a serial connection, a parallel connection or a combination operable as serial data connection and a parallel data connection. Moreover, the respective serial connections discussed above may be implemented in a number of forms including one or more wire leads between chip carriers each housing two dice arranged facing one another within a particular chip carrier.

FIG. 3A is a simplified perspective view of the integrated circuit die 101f shown in FIG. 1. The integrated circuit die 101f includes a number of data connections to surrounding dice. For example, the die 101f shares respective serial data connections 110e, 111b, 111f, 110f with the corresponding dice 101e, 101b, 101j, 101g, which are all included in the first layer. Also, for example, the die 101f shares a respective serial data connection 120f with the die 102f. Similar to FIG. 3A, FIG. 3B is a simplified perspective view of the integrated circuit 102f die shown in FIG. 1. For example, the die 102f shares respective serial data connections 112e, 113b, 113f, 112f with the corresponding dice 102e, 102b, 102j, 102g, which are all included in the second layer.

Figure 4:
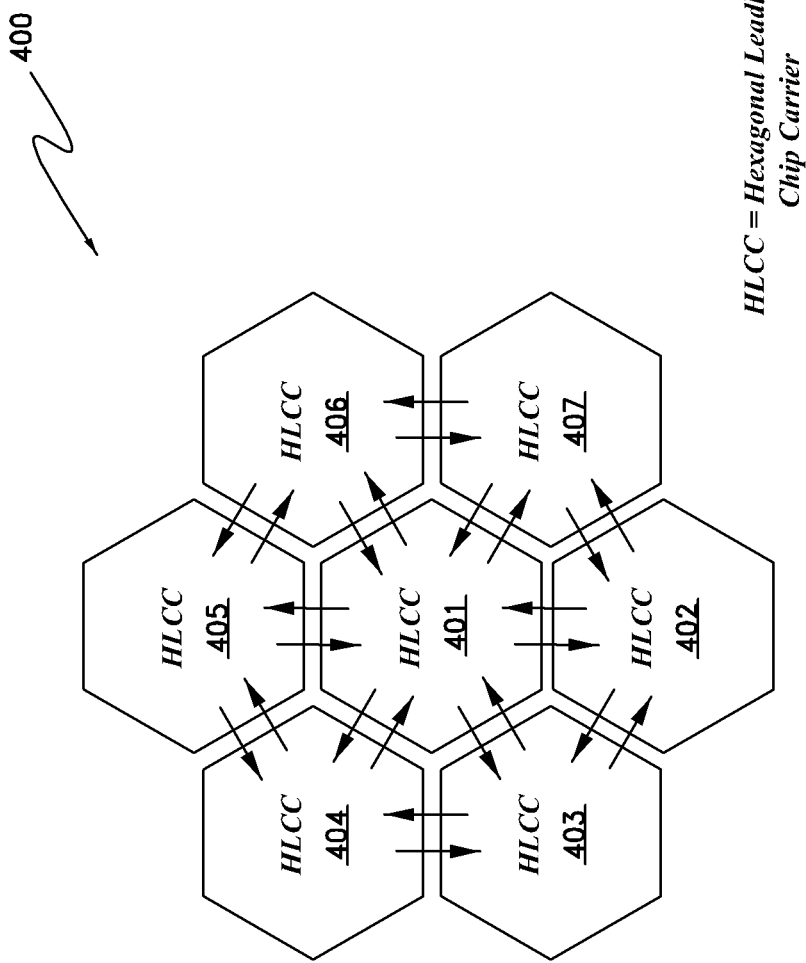
FIG. 4 is a simplified plan view of one embodiment of an arrangement of chip carriers configured to enable distributed computing systems, methods and apparatus.

FIG. 4 is a simplified plan view of one embodiment of an arrangement 400 of chip carriers configured to permit distributed computing systems, methods and apparatus. Specifically, as an illustrative example only, the arrangement includes seven chip carriers 401, 402, 403, 404, 405, 406, 407. Those skilled in the art will appreciate from the present disclosure that any number of chip carriers so configured may be arranged together. Each of the seven chip carriers 401, 402, 403, 404, 405, 406, 407 is configured to house two dice, one from each of two layers of dice (e.g. as illustrated in FIG. 1). The chip carrier 401 is placed at the center of a ring of chip carriers including chip carriers 402, 403, 404, 405, 406, 407. Accordingly, each of the chip carriers 402, 403, 404, 405, 406, 407 is a neighboring chip carrier to the chip carrier 401. And as shown in FIG. 4, each chip carrier, other than the chip carrier 401 has three neighboring chip carriers including the chip carrier 401. For example, the chip carrier 403 has the chip carriers 401, 402, 404 as neighbors. In one embodiment, a chip carrier has direct communication with at least one of the neighboring chip carriers. In one embodiment, a chip carrier has direction communication with all of the neighboring chip carriers. Furthermore, in one embodiment, a chip carrier communicates with non-neighboring chip carriers through a data path that traverses one or more neighboring chip carriers. As described in further detail below with reference to FIGS. 5 and 6, in various embodiments, the dice included within each chip carrier include features to enable more efficient communication with neighbors and non-neighbors. For example, a data path between the chip carrier 403 and the chip carrier 406 exists through the chip carrier 401 and at least another data path exists through chip carriers 404 and 405. Either of the aforementioned data paths can be made more efficient by routing data away from the primary functional blocks on the dice included in the chip carriers 401, 404 and 405. In other words, by preventing transient data from interfering substantially with the primary function of chip carriers on the data path, which do not directly contribute to the processing of the data at either end of the data path, delays in some cases are reduced.

Figure 5:
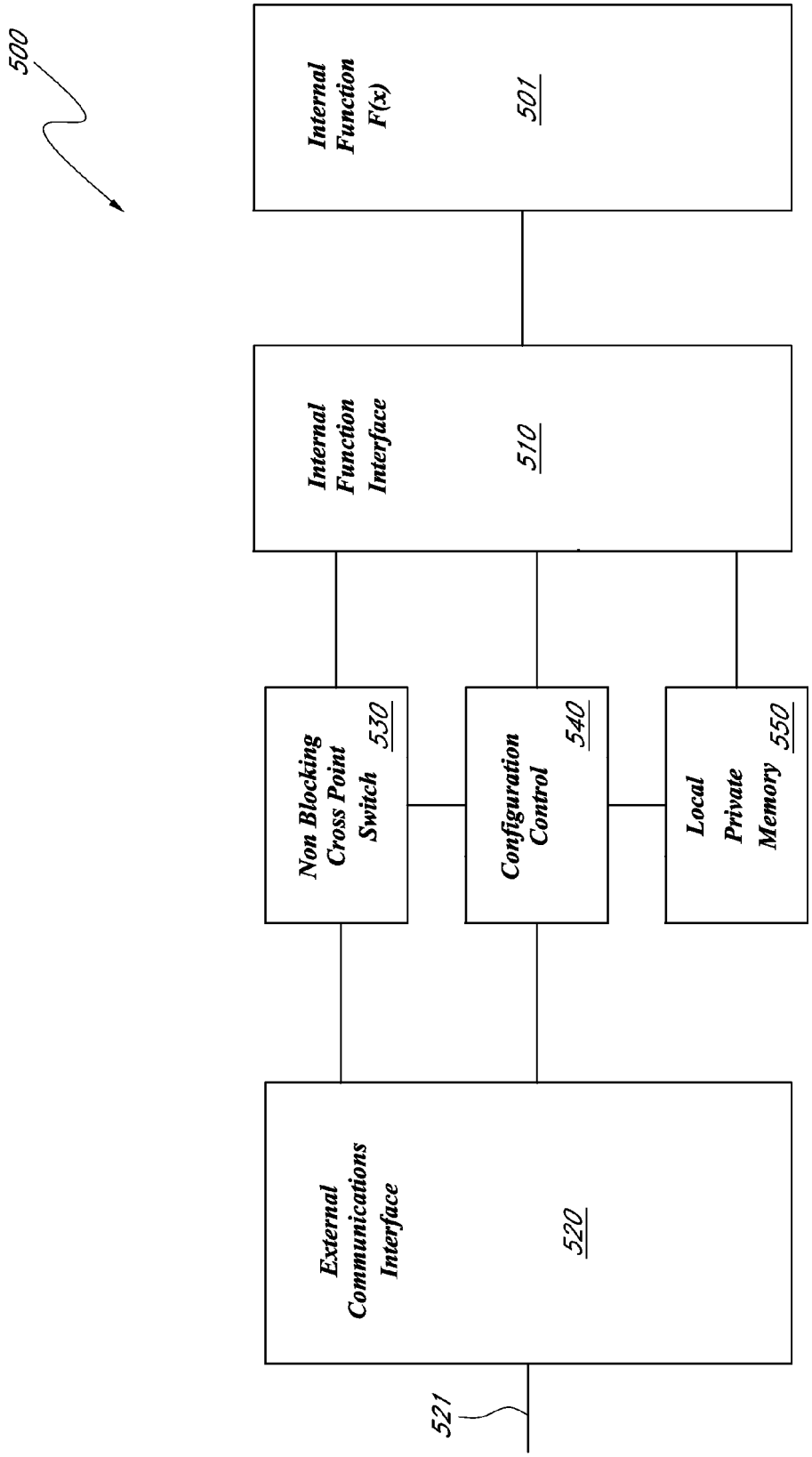
FIG. 5 is a block diagram of one embodiment of integrated circuit components arranged to enable distributed computing systems, methods and apparatus.

FIG. 5 is a block diagram of one embodiment of integrated circuit components arranged to enable distributed computing systems, methods and apparatus. Specifically, FIG. 5 illustrates an on-chip system 500 that includes features, in addition to the primary function of the chip, to enable more efficient communication with neighbors and non-neighbors. In particular, the system 500 includes an internal function module F(X) 501 which is the primary functional module of the on-chip system. For example, the internal function is a graphics processor, a general purpose processor, a data storage element or any other type of device that may be embodied as an integrated circuit. That is, the internal function module 501 can be any one of several functions, such as a processor, a memory, a multi-core processor, intelligent memory, a multi-array memory, a field programmable gate array (FPGA), an application specific integrated circuit (ASIC), an array sensor, a motion sensor, or a linear circuit. The internal function of the block is dependent on the ICs packaged within the chip carrier. Processed data from the internal function block is received in a parallel fashion and formatted into serial data which is output from the building block.

The system 500 also includes an external communications interface (ECI) 520, a non-blocking cross-point switch 530, a configuration control processor (CCP) 540, a local private memory (LPM) 550, and an internal function interface (IFI) 510. The ECI 520 is coupled to the non-blocking cross-point switch (CPS) 530, and the CCP 540. The ECI 520 also includes an external connection 521 that is connectable to external devices off-chip either serially or in parallel or a combination of serial and parallel. The non-blocking cross-point switch 530 is also coupled to the CCP 540 and the IFI 510. The LPM 550 is also coupled to the CCP 540 and the IFI 510. The IFI 510 is coupled to the internal function module 501. In one embodiment, the connection between the IFI 510 and the internal function module is a parallel data interface. In one embodiment, the connection between the IFI 510 and the internal function module is a serial data interface.

The ECI 520 provides direct unshared and shared communication connection with neighboring chip carriers. For example, the ECI 520 provides communication connection with six neighboring devices. Indirect communication with remote (non-neighboring) devices is also provided data paths through neighboring devices. A communication connection between devices provides transfer of information such as instructions, data, commands, and status.

In one embodiment, the ECI 520 contains six output signal lines and six input signal lines for communication outside the die. Thus a hexagonal chip carrier can be configured to have six interface sets, one set on each of the six sides of the chip carrier. In one embodiment, each of the six sets is made up of four signal lines, two independent full-duplex serial communication signal pairs, wherein one pair is connected to a first IC and the second pair is connected to a second IC. As mentioned above, each interface set can also include two power connections and five ground connections.

In one embodiment, static and/or dynamic control of the ECI 520 is performed by the CCP 540. For example, the CCP 540 provides activation and deactivation of the input signal lines, activation and deactivation of the output signal lines, activation and deactivation of a power-conserving sleep mode, selection of digital or linear transmission mode, configuration to select an orientation of the installed die to its device package, internal clock signal phase selection, preamble message disassembly and dissection, and exception handling.

In one embodiment, the CCP 540 also controls other elements of the device. One function of the CCP 540 is to provide assembly information and static and dynamic control of various elements of the device, including the ECI 520, the CPS 530, the LPM 550, and the IFI 510, to which the CCP 540 is connected via one or more buses.

Certain configuration information such as a very small iterative routine and history data can be written into a Write Once Read Many (WORM) element of the LPM 550 during manufacture. During various stages of manufacturing, assembly, and test operations, other data can be written into the LPM WORM by the CCP 540, such as the date of die wafer manufacture; various tests, dates, and results; wafer lot number; and other information.

Static and dynamic configuration and reconfiguration performed by the CCP 540 can be conducted at any time, including during program loading and execution. Safeguards can be implemented to prevent interference of executing programs or routines, except at prescribed operating points. For example, in one embodiment, the system can change from operating with one set of operating rules to operating with another set of operating rules. In one embodiment, more than one operating system will reside in a device package to allow the system to quickly change operating functions, on demand, to be able to respond to a different set of operational conditions. The system can respond by changing from one operating system to another, resulting from an external stimulus, to provide dynamic reconfiguration. Dynamic reconfiguration has the potential to expand the capability of a processing system by including multiple operating systems that can be selected to handle different computing needs, problems, or assignments. This can expand the range of work, processing power, and speed in handling complex tasks. It also allows the processing system to address multiple incoming threats, improving overall security. Multiple operating systems can quickly respond to a threat and, if the threat increases, while in a threat operating environment, the operating system can be elevated to a higher threat level by changing to another operating system. In another embodiment, the system, or portions thereof, can load a secondary operating system based on the primary threat. As mentioned above, the CCP 540 can control this configuration and reconfiguration of all the elements of a device die.

In one embodiment, the CCP 540 is configured to operate from firmware and software stored in the LPM 550. The LPM 550 can include, for example, write once read many (WORM) memory, random access memory (RAM), and electrically erasable and programmable read-only memory (EEPROM), which include flash memory. In another embodiment, the CCP 540 is additionally or alternatively configured to operate from firmware and software stored in a bulk memory system of the internal function of one or both of the embedded ICs.

In one embodiment, the CCP 540 of a device can read and write from the memory of the device, including erasing EEPROM of the device. In another embodiment, the CCP 540 can directly address the memory of neighboring devices and indirectly address remote memories, including both bulk memories of the internal functions and the LPM 550 of remote devices. In one embodiment, only the local CCP 540 of a device can write information into the WORM memory of the device; however, at least a portion of the information stored in the WORM memory can be accessible to other devices on a read only basis. In one embodiment, some of the information in the LPM 550 or bulk memory can only be accessed by the local CCP 540.

In one embodiment, the LPM WORM memory is used to retain information that is not intended to change, such as information relative to the history of the die, process tracking information that becomes available during the manufacture and assembly process, or a start up "boot strap" routine. In one embodiment, the "boot strap" firmware routine is a sparingly programmed reiterative loop routing intended to provide communication in a simple form so as to provide only the ability to load another program with a more substantial communication routine. In one embodiment, the routing includes a method whereby the CCP 540 escapes the reiterative loop to execute the second more substantial routine that allows further communication with other memories, registers, and logic of the die.

In one embodiment, the LPM 550 includes random access memory (RAM), accessible by the CCP 540. The RAM can include a volatile RAM scratch pad memory. The RAM can provide, among other things, volatile software program storage and temporary data storage. Because of the RAM memory volatility, any data in RAM memory can be lost in the event of a power failure or a complete power shut down. Thus, in one embodiment, a minimal "keep alive" current or voltage is implemented to prevent data from being lost when the chip is in a sleep mode of operation.

In one embodiment, the LPM 550 includes EEPROM for storage of data that is semi-permanent, such as constants, or storage of firmware. The EEPROM is non-volatile but can be electrically erased and re-written.

Write Once Read Many (WORM), Random Access Memory (RAM) and Electrically Erasable Programmable Read Only Memory (EEPROM) can be addressed as a block, that is, each has an addressable block of addresses within a block of addresses.

In one embodiment, the LPM 550 stores permanent data as well as dynamically changing data. Permanent data includes information such as manufacturing and assembly information and specific bootstrapping information. Dynamic data includes Configuration Control Processor program code and parameter data for the setup and control of internal portions of the device, including the local internal function module 501.

In operation, the CPS 530 generally provides selective connection between lines of the ECI and the IFI. In one embodiment, the CPS is a non-blocking switch which takes as input, signals from the ECI and the IFI and provides, as output, one of those same signals to the inputs of the ECI and IFI.

In one embodiment, the CPS 530 receives data from twelve ECI inputs and four IFI inputs. In one embodiment, the source and destination of signals are addressed via address registers which can include: source of all sixteen input signals as a group, destination of all sixteen output signals as group, source of all ECI input signals as a group, destination of all ECI output signals as a group, source of all external ECI input signals as a group, destination of all external ECI output signals as a group, source of all internal ECI input signals as a group, destination of all internal ECI input signals as a group, source of all IFI signals as a group, destination of all IFI signals as a group, source and destination of all input and output signals as group, or individually selected source and destination input and output signals as group.

The content of the CPS address registers can be updated by the incoming data address. The content can also be overwritten on at least a temporary basis by the CCP until control is released by the CCP 540. In one embodiment, when the CCP 540 takes control, it shuts down or diverts the effected signals and alerts the effected devises so as to prevent loss of data. Also, in one embodiment, the CCP 540 has the ability to redirect the input to output signal switch selection where data is routed between two devices via this intervening device.

In one embodiment, the CPS 530 is a 16×16×1 switch that steers data between six external data connections of a die and/or four internal data connections of the IFI with the die under direction of the CCP 540. In one embodiment, the chip carrier die utilizes six of the twelve external connections for communication to neighboring chip carrier and the remaining connections to the other die within the chip carrier. Although in one embodiment, the steering is performed by the CCP 540, in another embodiment, such as can be used during bootstrap/debug operations, firmware can set specific CPS 530 connections to steer data and controls from the ECI 520 to locations within the LPM 550 and to the controls of the CCP 540.

The CPS 530 contains connections to the ECI 520 and the IFI 510. The ECI 520 is described in detail above, whereas the IFI 510 is described below. The IFI 510 provides connections (buses) to the internal function module 501 which can include any logic function such as memory, data processor, ASIC, FPLA, sensor, etc. For example, depending on the internal function module 501, the IFI 510 can provide multiple 128-bit buses for connection to the internal function module 501.

In operation, the IFI 510 controls direct communication access to the internal function module 501. As such, it receives all or substantially all signals originating from the internal function module 501. The ECI 520 controls direct communication access with external devices. In one embodiment, the ECI 520 determines whether or not a received packet can be and/or is addressed to be processed by the internal function module 501. If the packet can be and/or is addressed to be processed by the internal function module 501, the ECI 520 passes the packet to the non-blocking CPS 530 and CCP 540. The packet is then passed through the IFI 510 to the internal function module 501 for substantive processing.

On the other hand, if the packet is addressed for another chip and/or cannot be serviced locally, and is thus merely passing through the system 500, the ECI 520 retransmits the packet to another chip, thereby preventing the packet from disturbing the primary function of the on-chip system 500.

In one embodiment, the chip carrier operates internally in serial fashion, with the exception of the IFI 510 which can operate in serial or parallel. In one embodiment, the internal function includes a parallel internal function, PF(x). For example, PF(x) can be implemented as a parallel processor or as a parallel memory, sensor, scan array, any function that originates as a parallel device that can be contained in the allotted area of the chip carrier.

In another embodiment, the internal function includes a serial internal function, SF(x). Serial processing arithmetic logic units (ALUs) provide certain advantages over parallel ALUs. One advantage is that serial processors are generally implemented with fewer logic elements than a parallel processor of equal capability. In some cases, a serial processing unit is much simpler than the parallel equivalent, having less transistors and/or a simpler design layout.

Further, many peripheral devices such as keyboard, mouse, data storage disks, monitors, music, USB, internet, etc., use a serial transmission interface. Using serial communications uses fewer wires, smaller less expensive connectors, and each device does not require a parallel-to-serial data converter to receive data and a serial-to-parallel data converter to send data. Since the above devices are all naturally serial devices, the logical transmission interface can be serial transmission of data.

Embodiments illustrating communication with a serial device are described below. In one embodiment, the system uses the clock signal supplied by the peripheral device to transfer data in both directions. Although the clock signal supplied by the system to the peripheral device can be many, many times faster than the peripheral clock rate, reliable transmission can still occur. When the system wishes to communicate with the peripheral device, the system places its high speed clock signal on the transmit line to the peripheral device. Whether or not the peripheral device can follow the clock signal, it will easily be able to discern the presence of signal on the line and send its slower clock signal back to the system on its transmit line. In response, the system can switch from its normal transmitted clock frequency to the speed of the peripheral clock signal and send the lower speed clock signal back to the peripheral device. Using this received clock from the system, the peripheral device can determine when the two machines are in sync and send an End of Transfer (EOT) back to the system. If the system and the peripheral device are not in sync, the system can adjust the return clock phase by relatively small increments until synchronization is achieved.

In the above embodiment, the system initiated communication with the peripheral device. In another embodiment, communication is initiated by the peripheral device. In one embodiment, A similar method is used.

Described below are various modes of communication operation and nodal control processing (NCP) enabled by these various modes. Those of skill in the art will appreciate that alternative embodiments can exclude some of the described modes or include other modes not described in detail herein.

Direct addressing of resources of near neighbor devices for passage of instructions, data, commands and status can use the (TRA) address contained in a standard format and protocol, as in all communications between devices. If the direct path port is busy or reserved, the message can be placed in a port queue for later transmission or sent as an indirect message via another intervening device. If the port is not available for some other reason, such as failure, the message can also be sent indirectly via another intervening device. If the port is reserved it can still be able to transmit messages, stored in queue, during non-busy periods of the reserved transmission port. Reserved ports can be configured to operate in one of at least two ways. In one embodiment, the reserved port is locked to a device other than the reserving device. In another embodiment, the device can share the port, holding priority access to the port for the reserving device.

With indirect addressing, the path to the remote destination terminal device can be selected in several ways. In one embodiment, indirect remote addressing takes place via at least one intervening device.

In one embodiment, particularly useful when there is a great amount of data to be transmitted or if time sensitivity cannot tolerate interruptions, there is provided a pre-reserved path from the sending device to the remote receiving terminal device. To reserve paths in intervening devises, an originating device can send a message to a remote receiving terminal device and via this message pre-reserves the path along the way, even in intervening devices. In one embodiment, this message includes an indication to either lock the reserved path or to not lock the reserved path. In one embodiment, the pre-reserved path remains in effect until instructed by the originating device to sever the path in a similar manner to that used to initiate the path. In another embodiment, the pre-reserved path is severed after a pre-determined amount of time if it is not used, thereby freeing system resources. In one embodiment, if the message indicates that the path is not to be locked, a higher priority transmission can request temporary use of the path on a non-interfering basis.

Reserving a path, in one case, simply means that the reserving device has the highest priority and will bypass the transmission queue and go to the first position of the queue. The reserved port can still be available to transmit messages from the port queue on a First In First Out (FIFO) basis. If the transmission path must always be available to the reserving device, a second case can provide the ability of the CCP 540 to lock out storage of messages to and/or transmissions from the queue.

Another embodiment of remote transmission is to place data in an available port queue for transmission on a first in (come) first out (served) (FIFO) basis when the queue is available.

Yet another embodiment of remote transmission is to pre-assign, by priority, positions in the port queue for transmission. This embodiment can advantageously be used for non-interfering transmission to/from the queue.

Yet another embodiment of remote transmission is a so-called "Hand-Off" of a message destined for a remote terminal device from the originating device to a near neighbor device. The receiving near neighbor device has the option to follow the addressing guideline it receives from the originating device; however, it also has the option to modify the address route because the addressed port has a large built up queue, the port is reserved, there is a better route available, to balance traffic of a transmission port, or for other reasons. The received device will then hand off the message to the next device over the selected port.

Still another embodiment of remote transmission can advantageously be used when a message is to be sent to all or a prescribed set of devices. Thus, the message is broadcast to the devices by spidering out from the originating device to the intended devices. This broadcast will take place in one of at least three ways: i) directly and automatically after an authority device transmits a "Device Reset" to the intended devices; ii) on a demand basis; or iii) on a non-interfering basis. A broadcast can take place via devices that are not a designated broadcast recipient. Broadcasting can be used, for example, to distribute software code and/or data to many carriers in a spider-type fashion to 'bulk load' groups of carriers.

Connection between the IFI 510 and the CPS 530 provide a pathway for instructions, addresses, commands, data, status, and other information between the ECI 520 and the internal function module 501. For test purposes, the CCP 540 can test the internal function or interact with the signals of the ECI 520 to perform tests of the ECI 520 or the internal function. The CCP 540 can, for example, cause the diversion of pre-determined signals to be read from certain locations of LPM 550 and signals to be stored in certain locations of LPM 550. In this way, the CCP 540 can access both local private memories and the internal function memory via the interface registers.

As shown in FIG. 5, the IFI 510 provides connections between the CCP 540, LPM 550, CPS 530 and the internal function module 501. In one embodiment, the internal function includes a processor in the lower die position and at least one of a memory, sensor, imager, or second processor in the upper die position. In one embodiment, the internal function includes a processor in the lower die position and a bulk memory in the upper die position. This processor-memory configuration can directly execute software or firmware applications stored in the memory through the use of parallel signal buses. In another particular embodiment, the internal function includes a processor in the lower die position and a sensor or imager in the upper die position, wherein the sensor or imager in the upper die position also includes memory. This memory can, for example, store software or firmware to support the sensor or imager functionalities.

A node can be capable of processing that standalone elements are incapable of. In one embodiment, "lock step execution" is controlled, not on a clock basis, but on an execution basis. A provision to prevent system lockup can also be included.

In one embodiment, NCP provides direct access from the periphery input signal of a chip carrier through the ECI 520 and the CPS 530 to the IFI 510 parallel register that services the internal function. Likewise, the internal function data is placed in a parallel output register in the IFI 510, passed directly through the CPS 530 and the ECI 520 to the periphery signal connection. In one embodiment, NCP can disallow port communication access, of unused ports, so as to not allow disruptive requests from other processes external to a node and not used in the node.

Each node can be assigned to specific functions or perform as a general purpose processor. For example, in various embodiments, a node can be used as a single processor, a pre processor, a data processor, a post processor, an input processor, an output processor, an intelligent memory control, an interface control processor, a memory control processor, an array processor, a wave front processor, or various permutations and combinations of the above. It will be appreciated that other interoperability uses of nodes is also envisioned. Further, each node can be dynamically and statically controlled to, e.g., change nodal connections.

Figure 6:
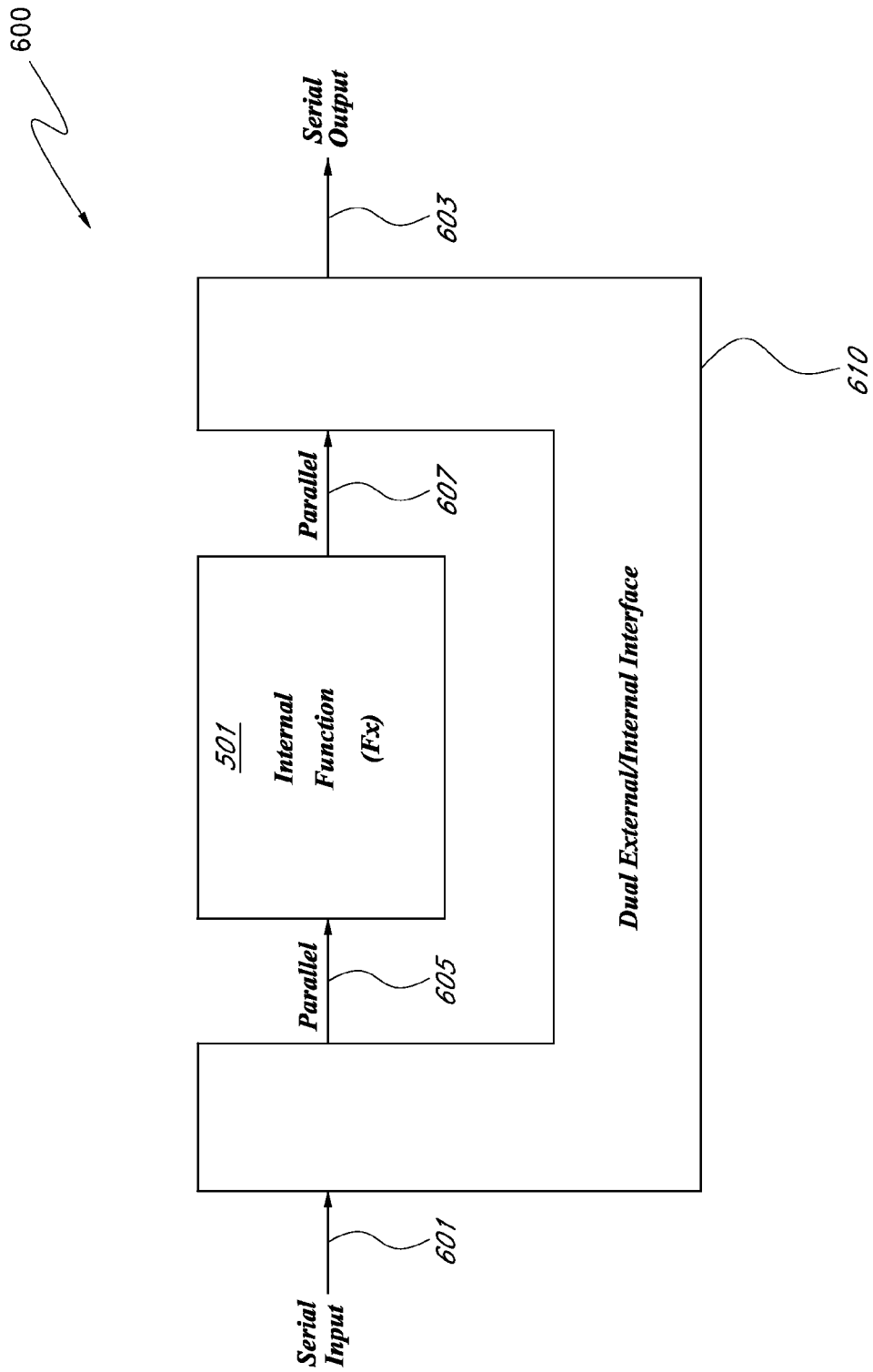
FIG. 6 is a block diagram of another embodiment of integrated circuit components arranged to enable distributed computing systems, methods and apparatus.

FIG. 6 is a block diagram of another embodiment of integrated circuit components arranged to enable distributed computing systems, methods and apparatus. Specifically, FIG. 6 illustrates an on-chip system 600 that includes features, in addition to the primary function of the chip, to enable more efficient communication with neighbors and non-neighbors. The on-chip system 600 is similar to and adapted from the on-chip system 500 illustrated in FIG. 5. Accordingly, elements common to both on-chip systems 500 and 600 share common reference indicia, and only differences between the two are described herein for the sake of brevity. Within the system 600, the external communications interface and internal communication interface are combined into a dual external-internal communications interface 610. The dual external-internal communications interface 610 includes a serial input 601 and a serial output 603 that are connectable to external devices off-chip. The dual external-internal communications interface 610 also includes a parallel output 605 and a parallel input 607 that are connectable to the internal function module 501.

Accordingly, in operation, the serial input 601 receives serial data communications from off-chip devices. The dual external-internal communications interface 610 converts the received serial data communications into a parallel stream which is transmitted to the internal function module 501 via the parallel output 605. In a reciprocal manner, the parallel input receives data communications from the internal function module 501. The dual external-internal communications interface 610 converts the received parallel data communications into a serial stream which is transmitted to external devices via the serial output 603.

Figure 7:
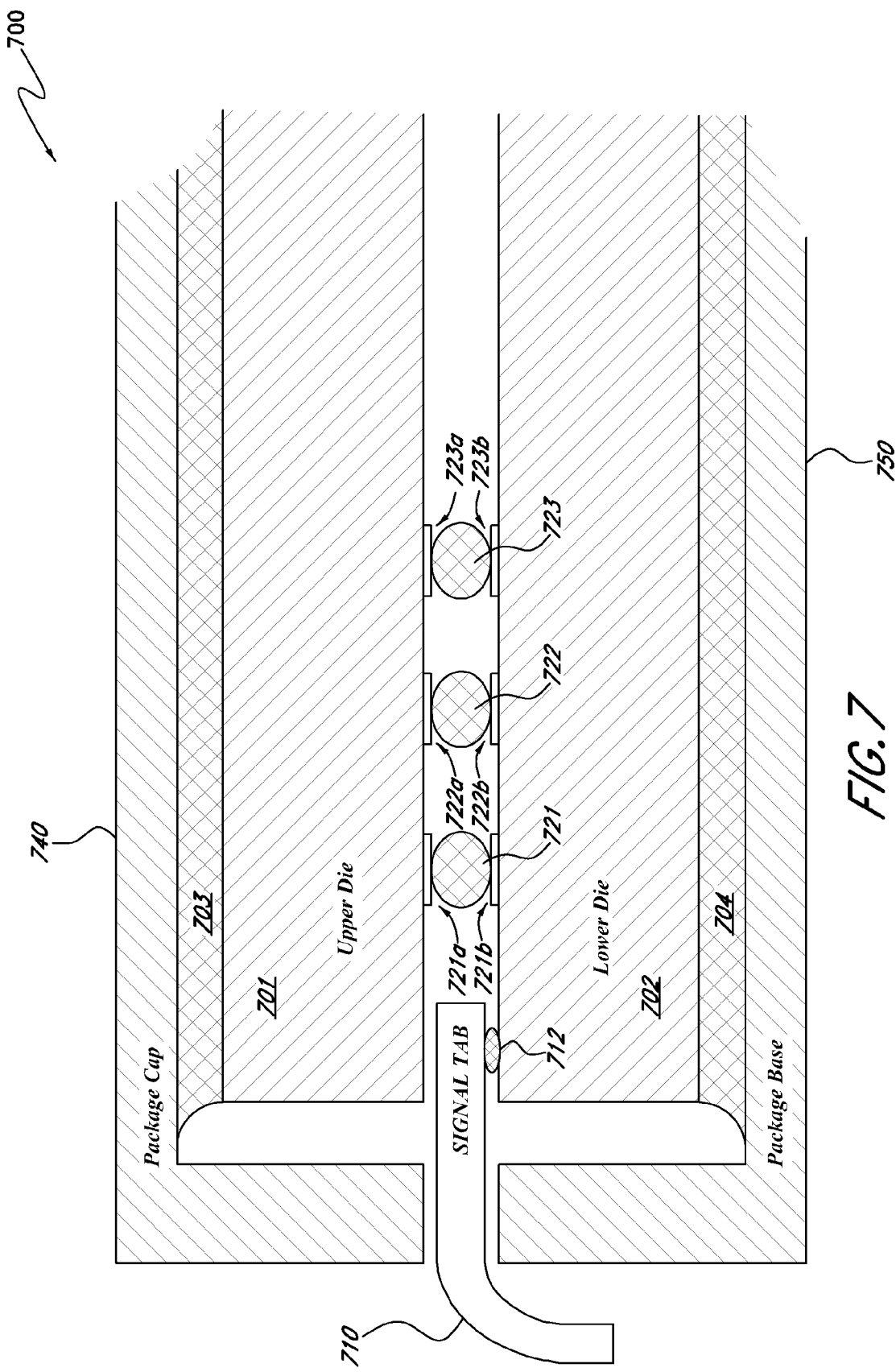
FIG. 7 is a cross sectional view of one embodiment of a chip carrier and two integrated circuit dice.

FIG. 7 is a cross sectional view of one embodiment of a chip carrier 700 and two integrated circuit dice 701, 702. The chip carrier 700 includes a first conductive tray, serving as a package cap 740, and a second conductive tray, serving as the package base 750. The first die 701 is substantially housed by the package cap 740. The first die 701 is optionally soldered to the package cap 740, as shown in FIG. 7. However, in one embodiment, the first die 701 is not soldered or connected to the package cap 740. The second die 702 is substantially housed by the package base 750. Pairs of connection pads 721a and 721b, 722a and 722b, and 723a and 723b on the two dice are coupled together using solder balls (or the like) 721, 722, 723, respectively. The second die 702 is connectable to another chip carrier or an external device via a signal tab 710 that is coupled to at least one connection tab on the second die 702.

Figure 8:
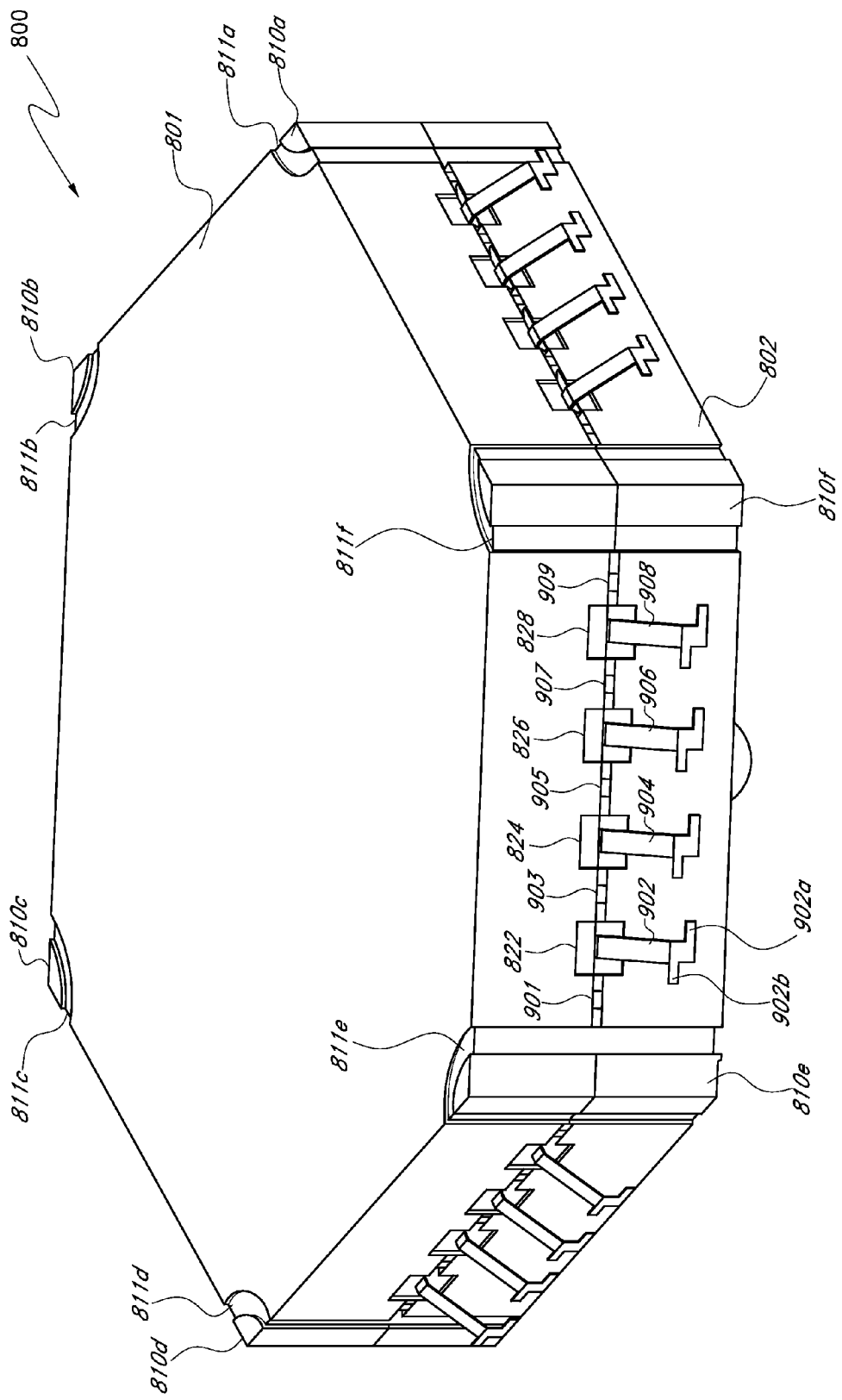
FIG. 8 is a simplified perspective view of one embodiment of a hexagonal chip carrier.

FIG. 8 is a simplified perspective view of one embodiment of a hexagonal chip carrier 800. The chip carrier 800 includes sixty connections that can be uniformly distributed about the six sides of the hexagon. The connections include six power connections, thirty ground connections, and twenty-four signal connections. As mentioned above, in one embodiment, the power connections and ground connections are attached directly to the substrate, whereas the signal pins are flying connections.

Specifically, the chip carrier 800 has a generally hexagonal shape and includes a first conductive tray 801 and a second conductive tray 802. A generally hexagonal or substantially hexagonal shape can vary from a hexagon by, for example, having rounded edges, squared edges, beveled edges etc. For the sake of example only, the first conductive tray 801 is referred to herein as the package cap 801, and the second conductive tray 802 is referred to herein as the package base 802. In one embodiment, the cap 801 and the base 802 are approximately 1.25 inches across and are made of aluminum nitride, which is an insulator with a relatively high thermal conductivity and a thermal coefficient of expansion similar to that of silicon (Si), of which the ICs can be made.

The chip carrier 800 also includes power supply lines 810a, 810b, 810c, 810d, 810e, 810f, each of which is located at a respective corner of the chip carrier 800. The power supply lines 810a, 810b, 810c, 810d, 810e, 810f are electrically isolated from the conductive package base 802 and cap 801 by corresponding insulating jacket portions 811a, 811b, 811c, 811d, 811e, 811f.

Each side of the chip carrier 800 includes five ground pins coupled to both the package base 802 and the package cap 801. For example, five ground pins 901, 903, 905, 907, 909 are visible on one side of the chip carrier 800. Each side of the chip carrier 800 also includes four signal pins that extend into and out of gaps in the sides of the chip carrier 800. For example, signal pins 902, 904, 906, 908 are visible on one side of the chip carrier 800. The signal pins 902, 904, 906, 908 extend through corresponding gaps 822, 824, 826, 828, respectively. In one embodiment, each signal pin is jacketed by a respective electrically insulating sleeve at least within the respective gap through which the signal pin extends. Moreover, while the chip carrier 800 shown has four signal pins and five ground pins on each side, those skilled in the art will appreciate that each side of a chip carrier of any shape can be configured to include any number of signal pins and any number of grounds pins.

Moreover, the chip carrier can be made in a variety of shapes, including triangular, square, rectangular, and hexagonal as shown in FIG. 8. In one embodiment, the chip carrier includes leaded connections, which are electrical connections having a length of wire or soldering pad that comes from the device. Leaded connections can be used for physical support, to transfer power, to probe circuits, and to transmit information. Leaded connections from through-hole components are called pins. These pins can bend under the package body like the letter J, called a J-lead, or come out, down, and form a flat foot for securing to the board, called an S-lead. In another embodiment, the chip carrier includes leadless connections. A leadless chip carrier (LCC) is a type of packaging for integrated circuits that includes leadless connections, which includes rounded pins through the edges of the package.

Figure 9A:
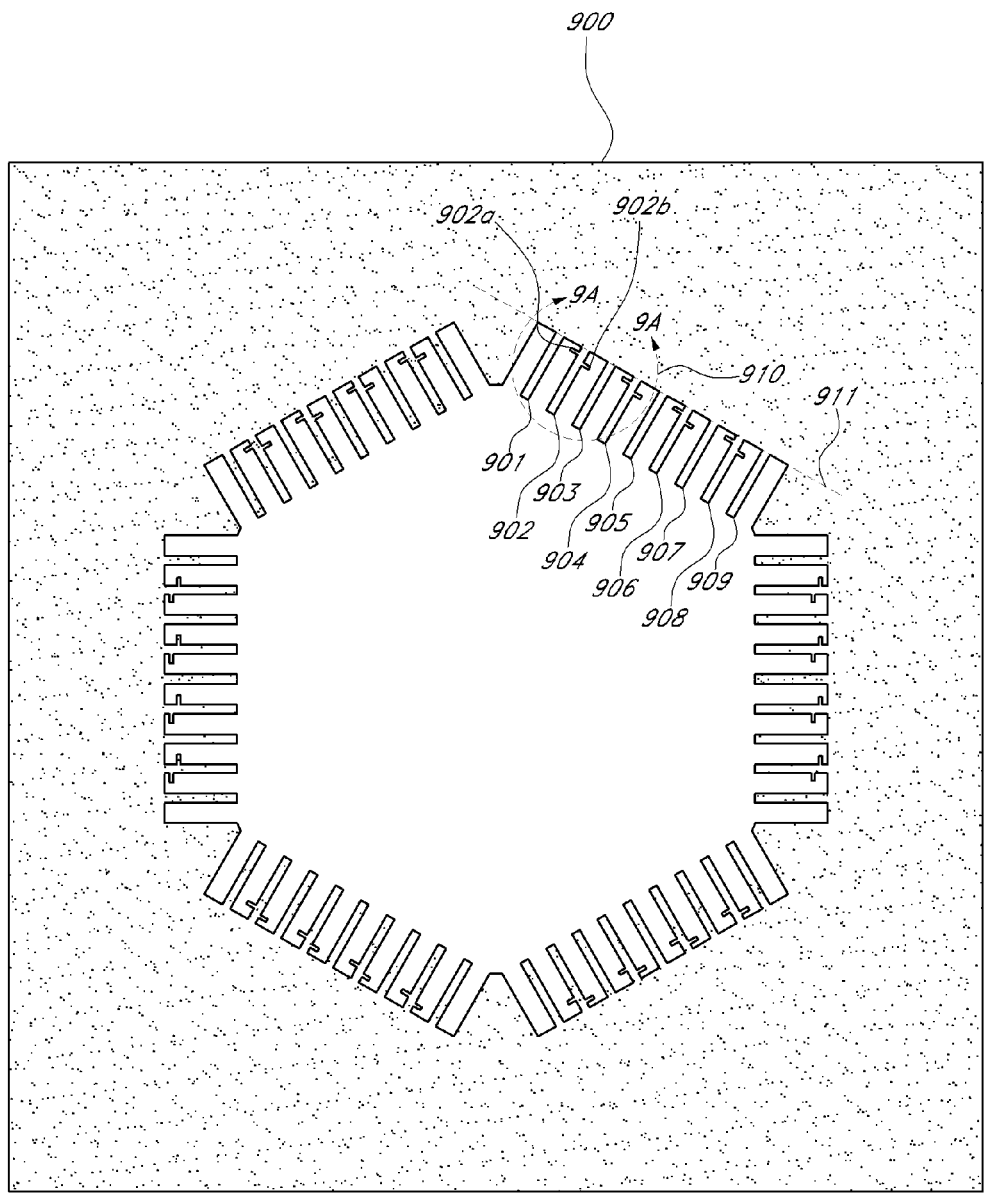
FIG. 9A is a top view of a tape automated bonding sheet.
Figure 9B:
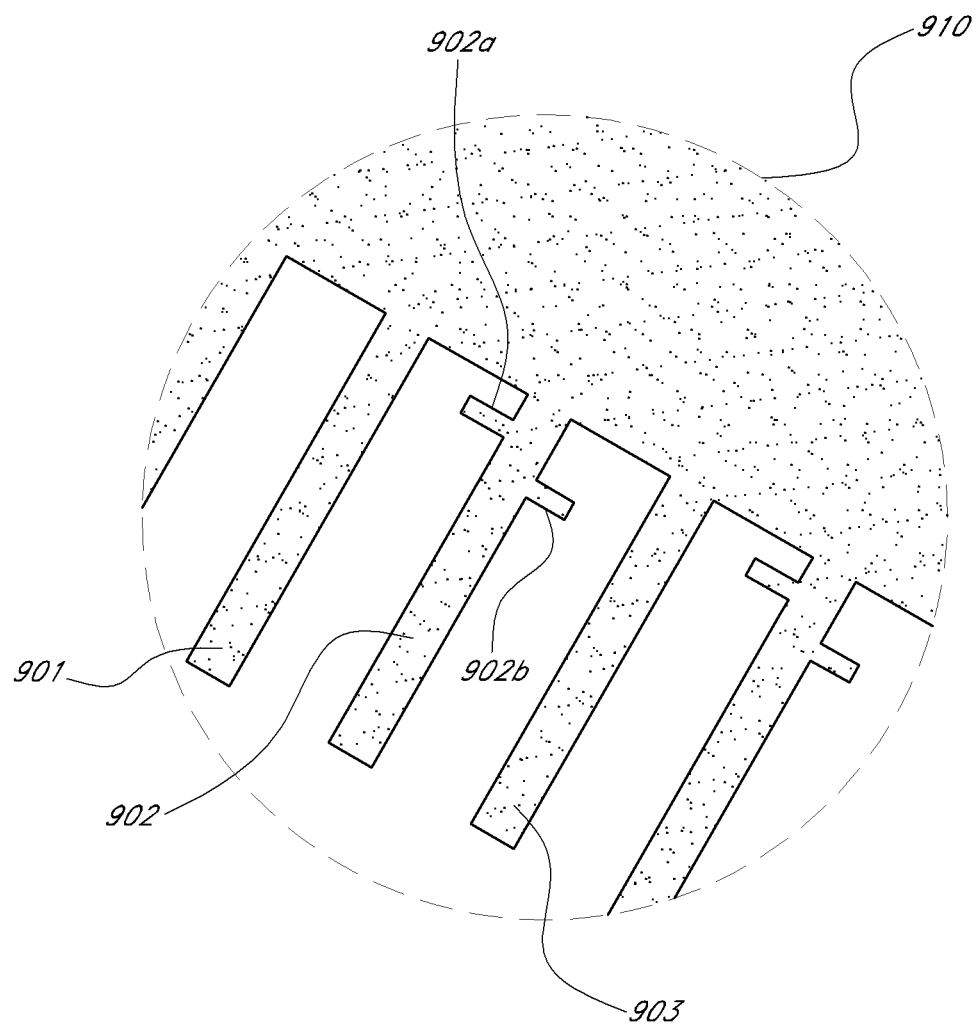
FIG. 9B is an enlarged plan view of the tape automated bonding sheet of FIG. 9A.

FIG. 9A is a top view of a tape automated bonding (TAB) sheet 900. The TAB sheet 900 provides one method of providing signal and ground tabs to one or more integrated circuit dice included in the package 800 described above with reference to FIG. 8. Accordingly, as a continuation of the example of FIG. 8, the signal pins 902, 904, 906, 908 and ground pins 901, 903, 905, 907, 909 illustrated in FIG. 8 are also shown in FIG. 9A. FIG. 9B is an enlarged plan view of a portion of the TAB sheet 900 of FIG. 9A, which specifically shows enlarged illustrations of the ground pins 901, 903, as well as the signal pin 902.

With further reference to FIG. 9A, the signal pins 902, 904, 906, 908 are formed when the excess material of the TAB sheet 900 is cut away along line 911. Similarly, ground pins 901, 903, 905, 907, 909 are formed when the excess material of the TAB sheet 900 is cut away along line 913. The signal pins and ground pins for other sides of the chip carrier 800 are formed in a similar manner using the unmarked pins shown in FIG. 9A. In one embodiment, all of the pins are formed simultaneously by shearing away the excess material after the TAB sheet 900 is placed over the combination of the package base 802 and at least one die.

In one embodiment, the TAB sheet 900 is made of relatively thin beryllium copper, on the order of two to three thousandths of an inch. In one embodiment the TAB sheet 900 is made of a thin material so as to provide flexure of the signal tabs between two adjacent chip carriers (see FIG. 10) to compensate for thermal expansion and contraction. One method of manufacturing the TAB sheet 900 is to etch the center area, leaving a patterned periphery to be sheared to the proper length during assembly along lines 911 and 913 for example.

Figure 10:
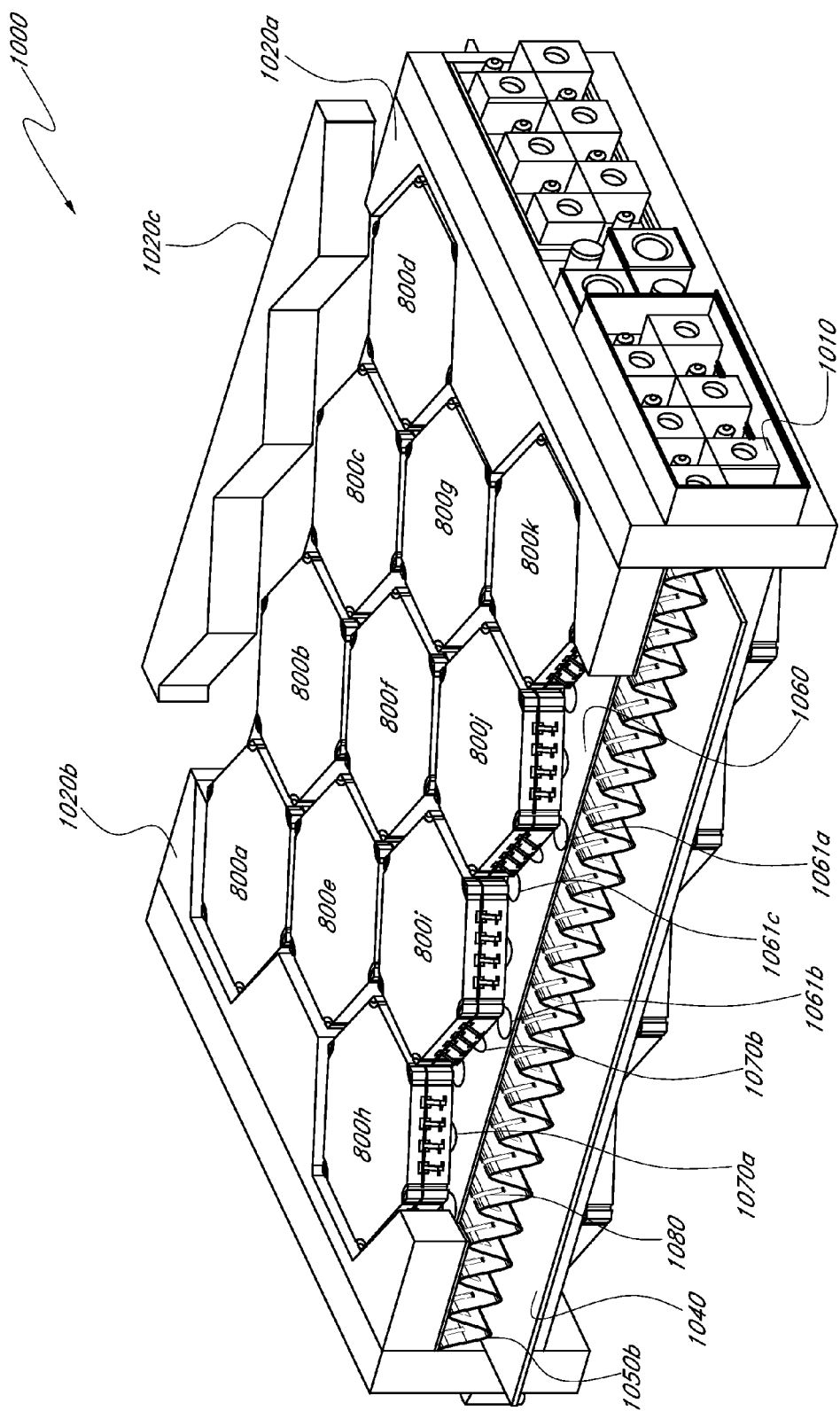
FIG. 10 is a simplified perspective view of one embodiment of a distributed computing module including a number of hexagonal chip carriers illustrated in FIG. 8.

FIG. 10 is a simplified perspective view of one embodiment of a distributed computing module, referred to herein as a process module element (PME) 1000, including a number of hexagonal chip carriers illustrated in FIG. 8. A PME as described herein is an assembly of multiple substrates with mounted chip carriers and input/output connectors, including signal and power connections. In one embodiment, the PME is constructed from approximately sixty piece parts, whereas the typical motherboard is assembled of upwards of six-hundred piece parts, including an approximately circuit board substrate having between eight and ten layers. As a result, such systems are generally assembly-intensive products.

FIG. 10 illustrates one embodiment of a PME 1000 including eleven hexagonal chip carriers 800a, 800b, 800c, 800d, 800e, 800f, 800g, 800h, 800i, 800j, 800k, each having substantially the same design as the chip carrier 800 shown in FIG. 8. The PME 1000 also includes a mounting substrate 1060 which is described in further detail below with reference to FIG. 13. However, briefly, the mounting substrate 1060 includes ground vias, such as the first and second vias 1070a and 1070b, and the power supply vias, such as the first, second and third power supply vias 1061a, 1061b, 1061c. The hexagonal chip carriers 800a, 800b, 800c, 800d, 800e, 800f, 800g, 800h, 800i, 800j, 800k are mounted on one side of the substrate 1060. A ribbon shaped heat sink 1050b is located on the opposite surface of the substrate 1060 as compared to the chip carriers. The ribbon shaped heat sink 1050b extends across the surface of the substrate 1060 and includes kerfs, such as kerfs 1080, spaced periodically or intermittently across the heat sink 1050b. The PME 1000 also include a heat transfer blade 1040 arranged on the opposite side of the heat sink 1050b as compared to the substrate 1060. The PME 1000 also includes sidewalls 1020a, 1020b, 1020c that serve the dual function of physically protecting the chip carriers and providing external connections to the hermaphroditic connectors 1010.

In the embodiment illustrated in FIG. 10, the hermaphrodite connector is approximately five inches high and approximately seven eighths of an inch wide. The HCON also has a surround shroud shell including an interference fit socket one half of the connector with a mating plug on the other half of the connector. The surround shroud shell can connect the power return ground. In one embodiment, the surround shroud shell is longer than the power and signal connections, thus being the first electrical connection between two devices as they are mated, whereas the power pins are next in length and next to make power connection. As the power return ground is the first connected and the power is next connected, both prior to signal connection, "hot swapping" of PME modules is made possible.

In one embodiment, the surrounding sidewalls provide a receiver for a number of input/output modules that contain signal drivers and receivers. The input/output insert modules can be one of a variety of insert modules, including a one meter drive fiber optic driver and receiver pair, a 30-meter drive fiber optic driver/receiver pair, a single-ended driver/receiver pair, or a double-ended driver/receiver pair. In one embodiment, the connector insert modules include the driver/receiver electronic circuitry as well as the connector pins and sockets.

The hermaphrodite connector allows a PME to be tested to be inserted into an operating PME having testing functionality. This PME to be tested can be introduced to an operating PME on a "hot swap" basis as described above, wherein plugging one unit into another will not disrupt an ongoing process in either module. While the operating PME can be structurally similar to the unit under test, the operating PME can also be a test module built for the test PME devices. In a similar manner, a test PME can be inserted into an operational PME to be tested.

In one embodiment, NCP provides direct access from the periphery input signal of a chip carrier through the ECI and the CPS to the IFI parallel register that services the internal function module. Likewise, the internal function data is placed in a parallel output register in the IFI, passed directly through the CPS and the ECI to the periphery signal connection. In one embodiment, NCP can disallow port communication access, of unused ports, so as to not allow disruptive requests from other processes external to a node and not used in the node.

Each node can be assigned to specific functions or perform as a general purpose processor. For example, in various embodiments, a node can be used as a single processor, a pre processor, a data processor, a post processor, an input processor, an output processor, an intelligent memory control, an interface control processor, a memory control processor, an array processor, a wave front processor, or various permutations and combinations of the above. It will be appreciated that other interoperability uses of nodes is also envisioned. Further, each node can be dynamically and statically controlled to, e.g., change nodal connections.

In one embodiment, all chip carriers in a node are similar and/or substantially identical. In other embodiments, multiple different kinds of chip carriers are present in a node. While each of the chip carriers in a node may or may not be identical, a few of the chip carriers (by reason of their unique mounted position on the substrate) can be used as interface controllers. Various interface embodiments are described above. Another functionality of a chip carrier is a Nodal Control Processor, which provides setup and control of a node or multiple nodes. Multiple nodes can be combined to work as a supernode.

Once a chip carrier, a node, a PME or a combination thereof has been manufactured, a programmer can utilize an external host computer to load and control program code into the device, designated the client device. Various software modules and tools can reside in a host computer such as a laptop, desktop, or a previously configured chip carrier-based computer running an operating system such as Linux. This software can be programmed to assist in the development of software modules, routines, nodal control, software tools, and operating systems that will load and control the program code residing in the client device. Such external software executes in the host computer and not in the client device. The host tools and software can include functionality to support the client device during manufacture, initial programming, testing, integration, application development, and debugging.

In one embodiment, the host provides software development tools for portions of a client device. For example, the client device can include a processor (and/or a memory, sensor, etc.) identified as the internal function. External tools to support the internal function include editors, compilers, linker, and loaders that produce code that can be executed on the client device. Other external tools can include tools and libraries stored on the host device to provide software mechanisms for communication with and control of the client device.

In one embodiment, the host operating system includes host driver software to initiate an interface connection between the host hardware and the client device hardware. These drivers can be low-level language routines called through software tools and the host operating system for communication with the client device.

Once the physical communications connections and the software mechanisms are in place, host software tools can use these communications mechanisms to setup and control the client device. These tools can be programmed to formulate message sequences and control bits to access the client device. These tools can include an initial bootstrapping sequence to load more intelligent and complex loaders and routines into the client device. The host can then treat the client device as a 'smart' device and communicate with it using high-level messages such that the client device can remotely perform setup and configuration processes at the direction of the host.

The host and client device can operate in tandem. The host, for example, can execute a user application partially on the host and partially on the client. As described above, the client device can be configured as one or more processing nodes having many chip carriers per processing node. In one embodiment, the host issues processing tasks to the client device and receives the results reported back to the host. In another embodiment, the host delegates an entire processing problem to the client device and then retrieves the solution from the client device.

Various software and firmware modules can also be executed by the client device. The client device can, for example, execute software applications designed specifically for the one or more of the internal function processors that resides within the client device. As mentioned above, at least some portions of the client device are externally controllable from the host for initial communication and bootstrap loading. In another embodiment, other portions of the client device are controllable from within the client device itself. For example, portions of the setup, controls, and internal logic are accessible from a configuration control processor through the use of internal software routines and tools. In one embodiment, internal software performs the main setup and configuration of the client hardware to support a user application and to communicate with the host. The user application can, for example, dynamically change hardware settings from within the user application by making calls to library routines which reside in an operating system of the internal function processor.

In one embodiment, operating system library routines executed by the internal function of the client device support the extensive capabilities of the client device. The routines can communicate to other portions of the hardware either through the CCP or directly. Internal software library routines can include routines for configuration/reconfiguration and the sending/receiving of messages across the communications paths of the client device. In one embodiment, messages pass through the input/output portions of the client device without interfering with the operation of the internal function processing. In another embodiment, messages are received into the internal function. In yet another embodiment, messages are sent from the internal function or memory of the client device.

In one embodiment, the internal software contains library routines available to a user application executed on a host device for performing control, setup, and data transfer. At the completion of data transfer, a signal can be returned through the library routine to the user application.

In one embodiment, the client device also contains a set of internal status and control routines that respond to queries from the host or other client devices. These queries can provide the hooks for debugging both the user application and client operating system. A programmer, developer, or application tester can use these status and control routines for software debugging. The routine can include routines for controlling the internal function, interrogating specific hardware, and viewing and changing memory. In a similar fashion, the host can include corresponding commands in the host software to status and debug the client device through a data connection path to these internal software status and control routines.

The internal software can be configured to support several chip carriers configured into a processing node with a group of local communications paths. When the processing node is operating, these communications paths, data transfers and signaling routines facilitate the user application coordination across the multiple chip carriers of the processing node.

As mentioned above with respect to the dynamic and static reconfigurability of such devices, at the completion of the user application, internal software can switch to another user application that is to be executed in the client device. In response, the operating system can reconfigure the hardware and the communications paths to support the new user application. In another embodiment, the operating system itself can be switched to a one of a different complexity based on the specific user application and its processing requirements.

In one embodiment, a client device is configured by software executed on a host device to initially define the interconnections between client devices. After the interconnections are defined, the operating system and user application software of the client device is loaded into the associated hardware by using software tools executed on a host computer.

Additional software executed on a host device can reconfigure the interconnections and communications paths within the client device while the current user application is executing on the client device. The reconfiguration can also allow the change of the user application and an operating system defined to support the application requirements. In one embodiment, when the first user application completes, the second user application is ready to reconfigure the hardware architecture and required communications paths within a few clock cycles.

Dynamic configuration can be directed from a host computer or it can be directed from within the client device itself through, e.g., library routine calls. These calls can be based from the currently configured client devices or it can be from an additional device directing the reconfiguration, such as with the PME Module Control Processor.

Dynamic configuration can, in one embodiment, support a 'failed component' workaround. For example, if the failed component is an input/output, a different input/output path can be selected to be used. If the failed component is the internal function processor of a first chip carrier, a second chip carrier can be used, wherein the input/output connections are reassigned and the program and data in the memory of the first chip carrier are reassigned to the second chip carrier.

In one embodiment, chip carriers embodied in a client device are uniquely determined by their physical location on the client device, an internal identifier, and by software which executes within each chip carrier. In one embodiment, the client device itself has similar identification information stored within it. This chip carrier software can range from 'stand alone' mathematical type routines to operating systems. The desired configuration of the client device can be changed at any time to support this range of processing capabilities.

In one embodiment, a user can determine the complexity of support required for the particular application and select the appropriate operating system. In another embodiment, the appropriate operating system is automatically selected based on the support required. A number of operating systems of varying complexity are available for selection. The complexity can, for example, be based on the range of operating system calls that the user software uses. For example, a first operating system can support a few tasks which communicate with near neighbor chip carriers of a processing node and does not support dynamic reconfiguration. A second operating system can support communication between processing nodes either on the same or distant PME and also support dynamic reconfiguration of subordinate processing nodes to add or subtract processing power of the user application software.

During the development of the particular application, software tools executed on a host computer can configure the particular client device operating systems and libraries to form the executable code which will execute in the client device or the chip carriers thereof. This executable code, including operating systems and user applications, can be transferred to the client device hardware to form a configured system. After this configuration is set, the software tools executed on the host computer can download changes in the background to the initial configuration concurrently while the client device is executing other software. In one embodiment, these changes are coordinated with the client device hardware and software so as to not interfere with the current client device processing.

FIG. 10 above illustrates one embodiment of a PME which can be used as a client device. From the figure, it is evident that certain of the chip carriers are proximal to the input/output interfaces. These chip carriers, or others, can be designated Module Control Processors (MCPs) and loaded with MCP Software to control the interaction of the PME with other devices. The MCP can also be configured to handle the configuration/reconfiguration of the other chip carriers on the PME. The MCP can also be configured to set up the communications paths between chip carriers and to initialize the user application software in the chip carriers. While, in one embodiment described above, these tasks are handled by a host computer, in another embodiment, they are instead 'off-loaded' to the MCP for additional flexibility. With this flexibility, the MCP(s) of the client device can direct their own reconfiguration by calling appropriate software reconfiguration routines.

Data passed to/from the PME communications paths are routed through the input/output portion of the MCPs. In one embodiment, the data is passed directly to other chip carriers on the PME bypassing the internal function and memory of the MCP, whereas in another embodiment, the MCP captures the data, interprets the data, and then directs the data to the appropriate processing node or chip carrier. This capture, interpretation, and direction forms an intermediate level of task control within the client device. In some embodiments, multiple PMEs operate together as a processing node. The Module Control Processors within the multi-PME node can be configured to handle intermediate data transfer and reconfiguration control for the processing node.

As mentioned above, the messages can be transmitted in a broadcasting fashion. Broadcasting can be used, for example, to distribute software code and/or data to many carriers in a spider-type fashion to 'bulk load' groups of carriers. Broadcasting, as described above, can be used to load software into many client devices without the need for the host to individually load each client device.

In one embodiment, software for individual client devices is broadcast to all devices and each individual client device discards information not intended for the device. The broadcast software can address individual client devices using a unique identification number stored within each client device (or chip carrier thereof) during manufacture or testing.

In one embodiment, bootstrapping is used to set up the communications paths to and through multiple client devices. After this is completed, information is broadcast to a number of devices and the client devices can begin processing. Broadcasting can be used in the initial setup of devices or for upgrading portions of the devices. These broadcast techniques allow the host to transmit information to specifically identified client devices.

As described above, processor nodes support distributed processing with additional features such as pre-processing, instruction processing, and post-processing. In one embodiment, a processor node is dynamically configurable to operate as a distributed processing system, whereas in another embodiment, a processor node is dynamically configured to operate in a traditional processing method as utilized by contemporary systems.

Distributed processing can be used to provide greater process transaction throughput by using more than one chip carrier of a processor node (or more than one processor node) to operate on data in a pipeline fashion. For example, using five Hexagonal Leadless Chip Carriers (HLCCs) forming a node could at any point in time operate on five or more different instructions simultaneously. In one embodiment, during a first clock period, an instruction is fetched by one chip carrier operating as an Instruction Fetch Processor (IFP); during a second clock period, the instruction is interpreted by the IFP and other chip carriers operating as Operand Fetch Processors (OFPs) are directed where to fetch operands; during a third clock period, the OFPs fetch various operands; during a fourth clock period, a chip carrier acting as an Instruction Processor (IP) performs the instruction directed by the IFP; and during a fifth clock period, a chip carrier acting as an Instruction Result Processor (IRP) stores the data, from the IP, in the location directed by the IFP. FIG. 10 illustrates a processor node with components designated as in the above example. The Instruction Fetch Processor (IFP), in one embodiment, works in a look-ahead program timing mode and thus, out of sequence jumps (branch) to other locations can be anticipated in most cases and therefore reduce precious processing time.

Figure 11:
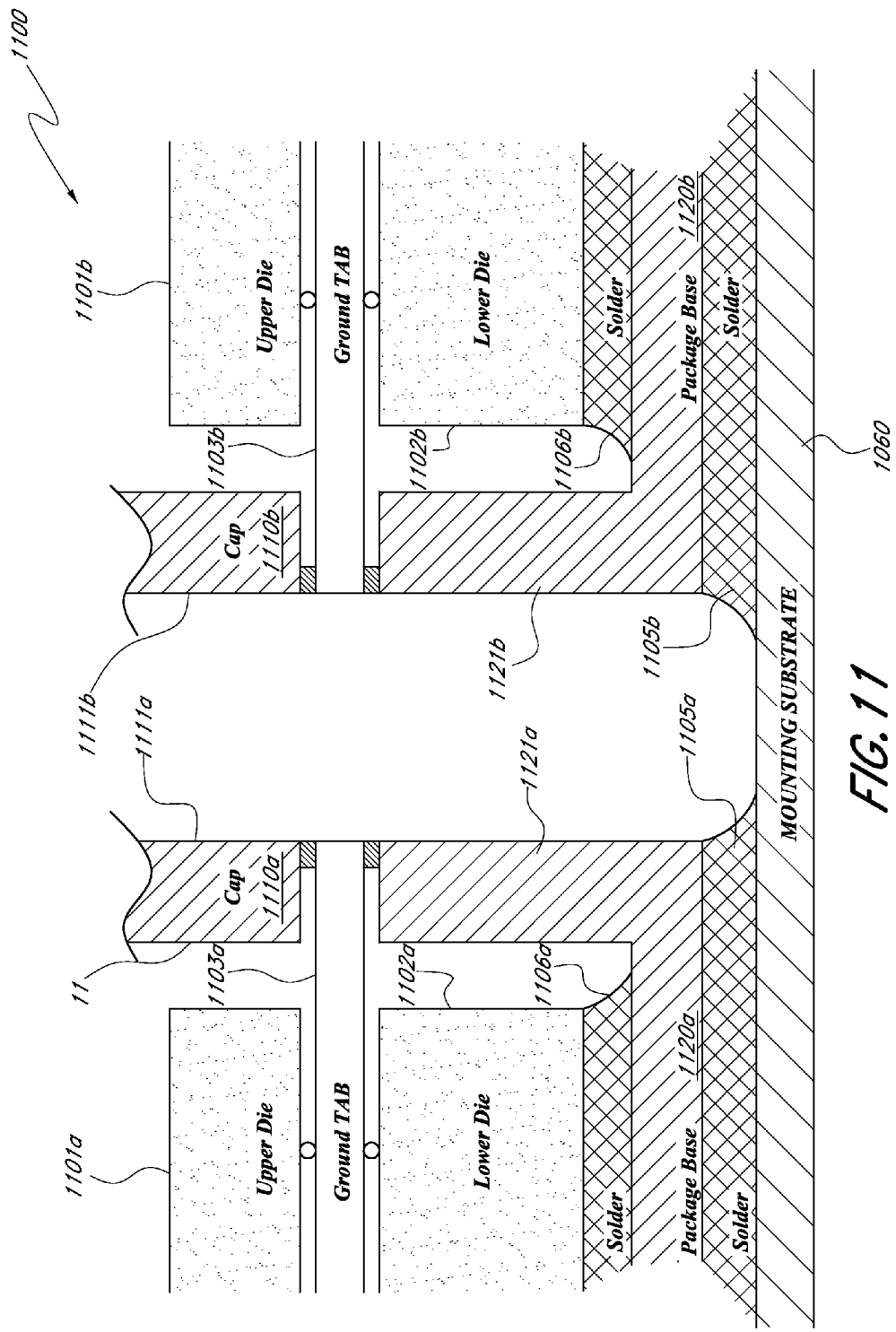
FIG. 11 is a cross sectional view of one embodiment of two chip carriers.

FIG. 11 is a cross sectional view of one embodiment of two chip carriers 1100 mounted on a substrate 1060. The first of the two chip carriers 1100 includes a package base 1120a, a lower die 1102a, a ground tab 1103a, an upper die 1101a and a package cap 1110a. The package base 1120a is fused to the substrate 1060 with solder 1105a. The lower die 1102a is fused to the package base 1120a with solder 1106a. The ground tab 1103a is electrically coupled both the package base 1120a and the package cap 1110a to receive ground potential. The ground tab 1103a is also coupled to both the upper die 1101a and the lower die 1102a using solder balls (or the like). Similarly, the second of the two chip carriers 1100 includes a package base 1120b, a lower die 1102b, a ground tab 1103b, an upper die 1101b and a package cap 1110b. The package base 1120b is fused to the substrate 1060 with solder 1105b. The lower die 1102b is fused to the package base 1120b with solder 1106b. The ground tab 1103b is electrically coupled both the package base 1120b and the package cap 1110b to receive ground potential. The ground tab 1103b is also coupled to both the upper die 1101b and the lower die 1102b using solder balls (or the like).

With further reference to FIG. 11, one method of manufacturing such a chip carrier is as follows. First, align and reflow solder the lower die 1102 to the cavity of the carrier package base 1120a. Second, position a TAB sheet over the package base 1120a housing the lower die 1102a. Third, position the upper die 1101a over the TAB sheet and lower die assembly. Fourth, reflow solder the upper die 1101a to the TAB sheet, the lower die 1102a and the package cap 1110a. In one embodiment, the upper die 1101a is not soldered to the package cap 1110a. Fifth, reform the signal leads of the TAB sheet for connection to neighboring devices so as to provide compensation of expansion and contraction due to temperature variations. Sixth, place and cement the package cap 1110a to the assembly providing a micro strip coaxial transmission path embedded in a dielectric insulator for each signal line. Finally, solder the power and ground to the package cap 1110a, package base 1120a and TAB sheet. Those skilled in the art will appreciate that the above describes but one embodiment of manufacturing a stack and that other methods formed by removing, adding, or altering the above steps can be used. Moreover, those skilled in the art will appreciate that specific connections to particular signal pins and connection pads have not been exhaustively described for the sake of brevity.

Figure 12:
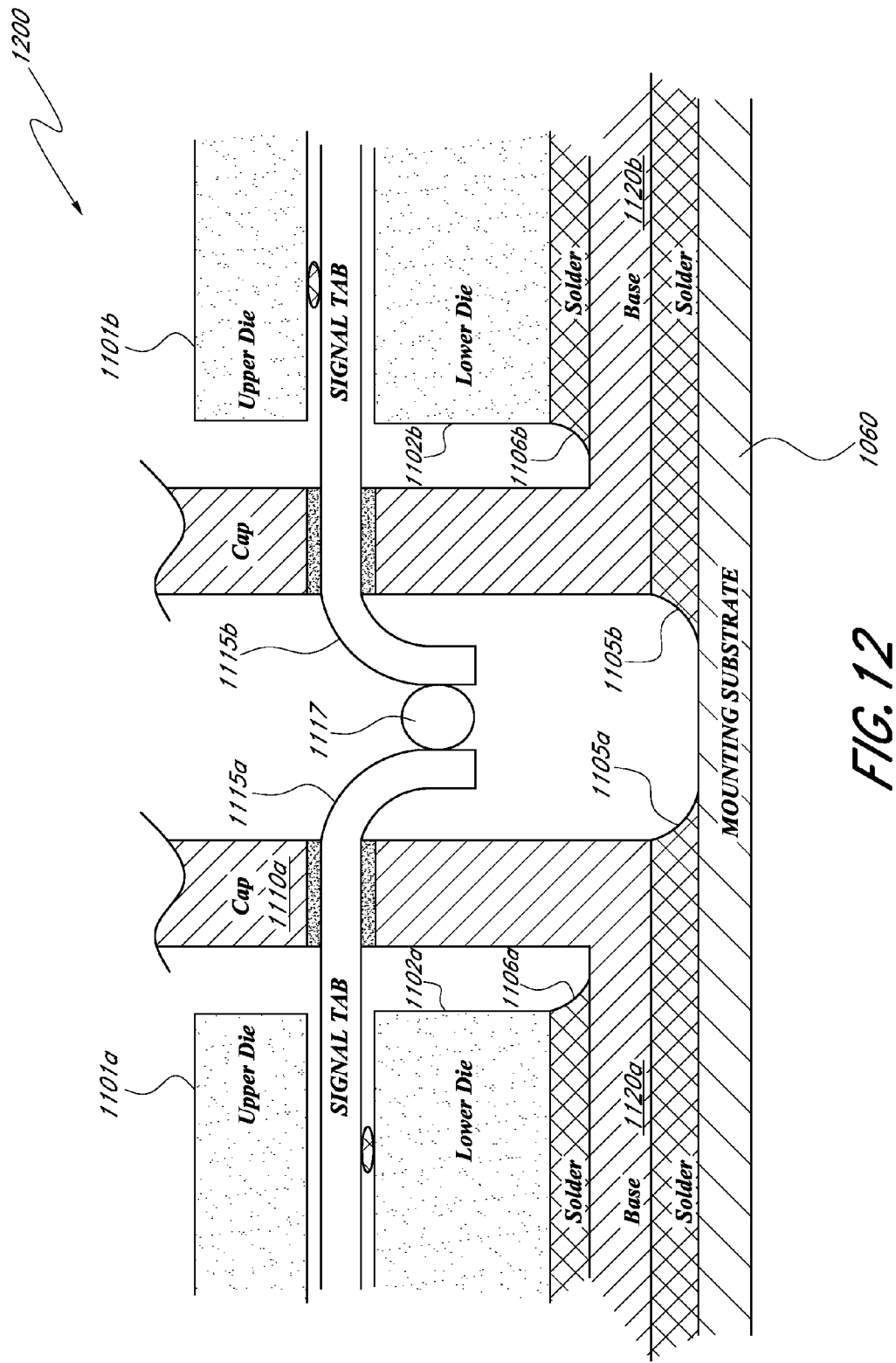
FIG. 12 is another cross sectional view of one embodiment of two chip carriers.

FIG. 12 is another cross sectional view of one embodiment of two chip carriers 1200. The two chip carries 1200 are similar to and adapted from the two chip carriers 1100 illustrated in FIG. 11. Accordingly, elements common to both chip carriers 1100 and 1200 share common reference indicia, and only differences between the two are described herein for the sake of brevity. Specifically, the two chip carriers 1200 include first and second signal tabs 1115a and 1115b in place of the first and second ground tabs 1103a and 1103b illustrated in FIG. 11. The first signal tab 1115a is coupled to a connection pad on the lower die 1102a and is electrically shielded from the package base 1120a and package cap 1110a. Similarly, the second signal tab 1115b is coupled to a connection pad on the upper die 1101b and is electrically shielded from the package base 1120b and package cap 1110b. The first and second signal tabs 1115a and 1115b are electrically connected with solder ball 1117, which thereby creates a data path from the lower die 1102a to the upper die 1101b. Moreover, those skilled in the art will appreciate that from the present disclosure that any combination of connections can be made between the dice 1101a, 1102a, 1101b, 1102b using signal tabs, and the scope of the claims is in no way limited by the example illustrated in FIG. 12.

Figure 13:
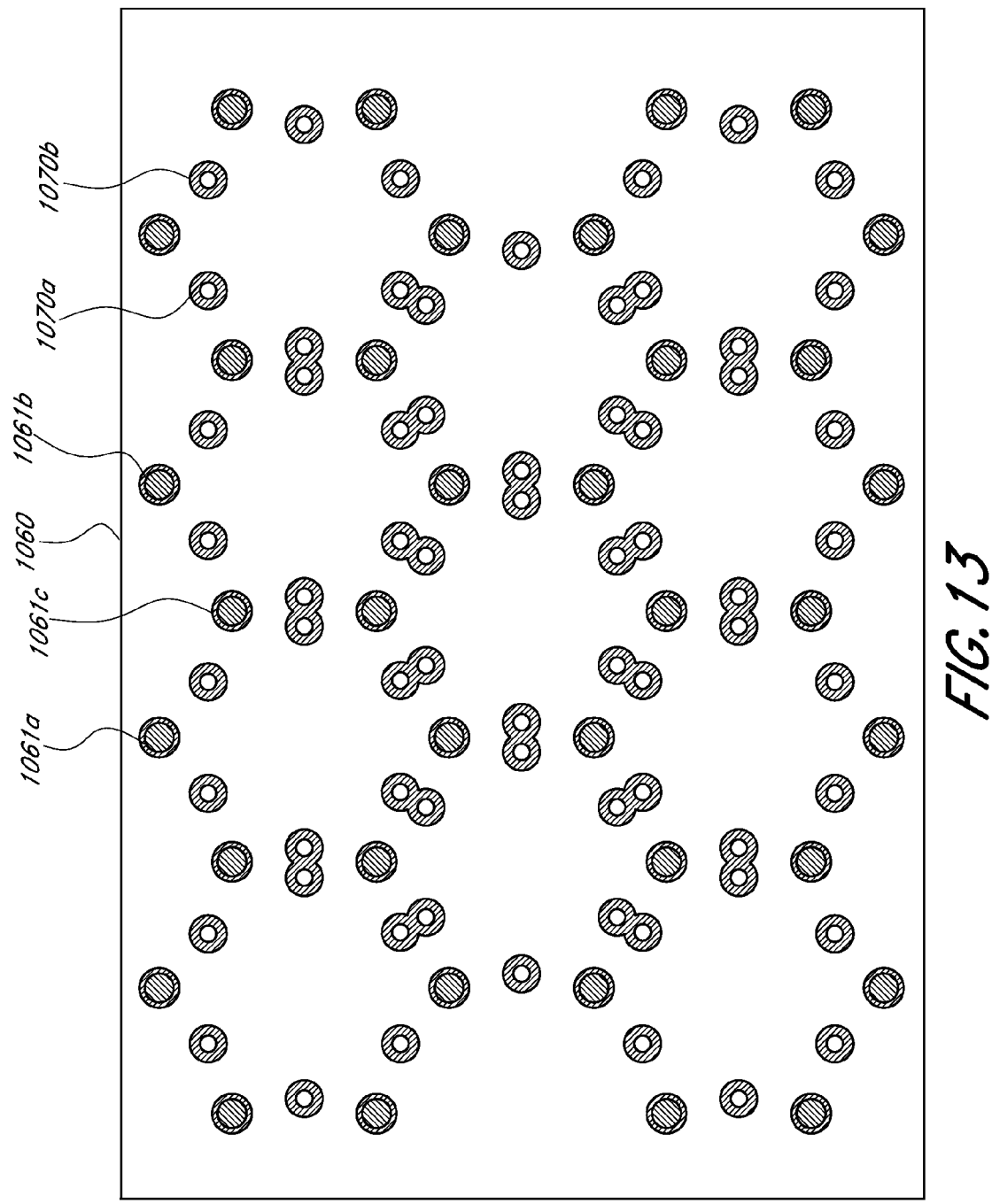
FIG. 13 is a plan view of one embodiment of a substrate including ground and power connections.

FIG. 13 is a plan view of one embodiment of the substrate 1060 included in the PME illustrated in FIG. 10. In one embodiment, the substrate 1060 is conductive and includes a number of voltage connections arranged so as to provide at least one of power and ground levels to one or more chip carriers. For example, in one embodiment, in operation the substrate 1060 is at the same potential as electrical ground. The ground potential is established and maintained by ground vias, such as the first and second vias 1070a and 1070b. The first and second vias 1070a and 1070b, for example, are electrically coupled to the substrate 1060. In the example illustrated in FIG. 13, the ground vias are interspersed between the power supply vias, such as the first, second and third power supply vias 1061a, 1061b, 1061c. The power supply vias are electrically insulated from the substrate and are arranged so as to connect to insulated power lines located at the corners of the hexagonal chip carriers. Moreover, while the substrate 1060 is specifically arranged for receiving and supporting hexagonally-shaped chip carriers, those skilled in the art will appreciate that in another embodiment, the ground and power vias can be arranged to accommodate other shapes of chip carriers, such as rectangular and square chip carriers.

Figure 14B:
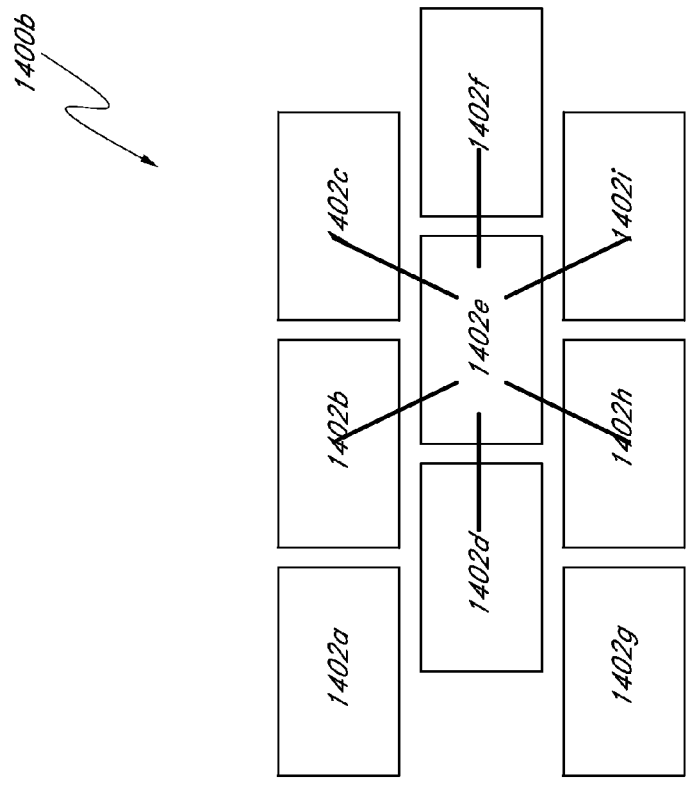
FIG. 14B is a plan view of one embodiment of an arrangement of chip carriers.
Figure 14A:
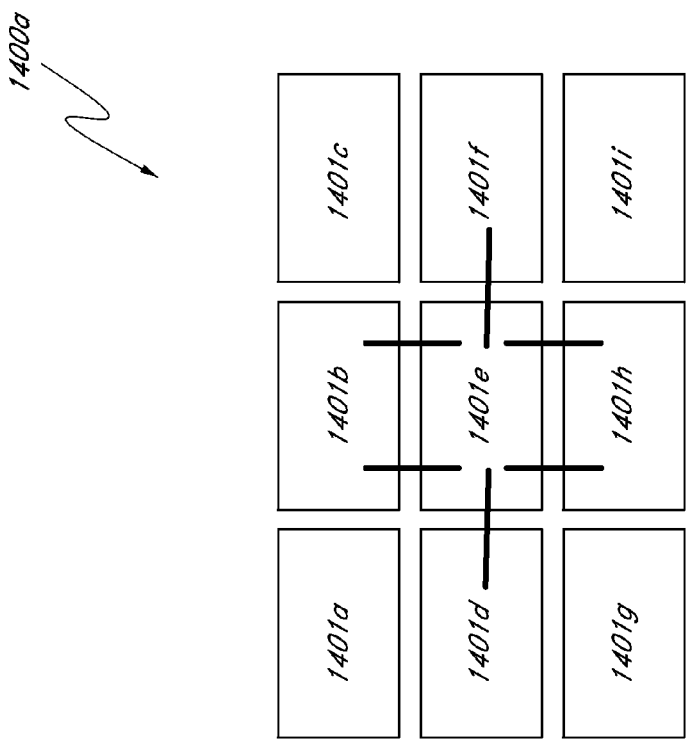
FIG. 14A is a plan view of one embodiment of an arrangement of chip carriers.

FIG. 14A is a plan view of one embodiment of an arrangement 1400a of rectangular chip carriers arranged in a row-by-column manner, such that each chip carrier has four neighbors with which communication is potentially available.

Specifically, the arrangement 1400a includes nine chip carriers 1401a, 1401b, 1401c, 1401d, 1401e, 1401f, 1401g, 1401h, 1401i. The chip carrier 1401e is in the center of a ring formed by the chip carriers 1401a, 1401b, 1401c, 1401d, 1401f, 1401g, 1401h, 1401i. However, since the chip carriers 1401a, 1401c, 1401g, 1401i are located diagonally away from the corners of chip carrier 1401e, it is difficult for chip carrier 1401e to establish direct communication with the chip carriers 1401a, 1401c, 1401g, 1401i. On the other hand, the chip carriers 1401b, 1401d, 1401f, 1401h are beside broad sides of the chip carrier 1401e, and as such, it is relatively more convenient for the chip carrier 1401e to establish direct communication with these neighboring chip carriers.

FIG. 14B is a plan view of one embodiment of another arrangement 1400b of rectangular chip carriers arranged in a brick pattern, such that each chip carrier has six neighbors with which communication is potentially available. Specifically, the arrangement 1400b includes nine chip carriers 1402a, 1402b, 1402c, 1402d, 1402e, 1402f, 1402g, 1402h, 1402i. The chip carrier 1402e is in the center of a ring formed by the chip carriers 1401b, 1401c, 1401d, 1401f, 1401h, 1401i. Moreover, as result of the brick pattern arrangement, each of the chip carriers 1401b, 1401c, 1401d, 1401f, 1401h, 1401i is considered a neighbor to the chip carrier 1402e. Accordingly, in one embodiment the chip carrier 1402e is able to establish direct communication with each of the chip carriers 1401b, 1401c, 1401d, 1401f, 1401h, 1401i without sending signals through other chip carriers or over a printed circuit board.

Figure 15:
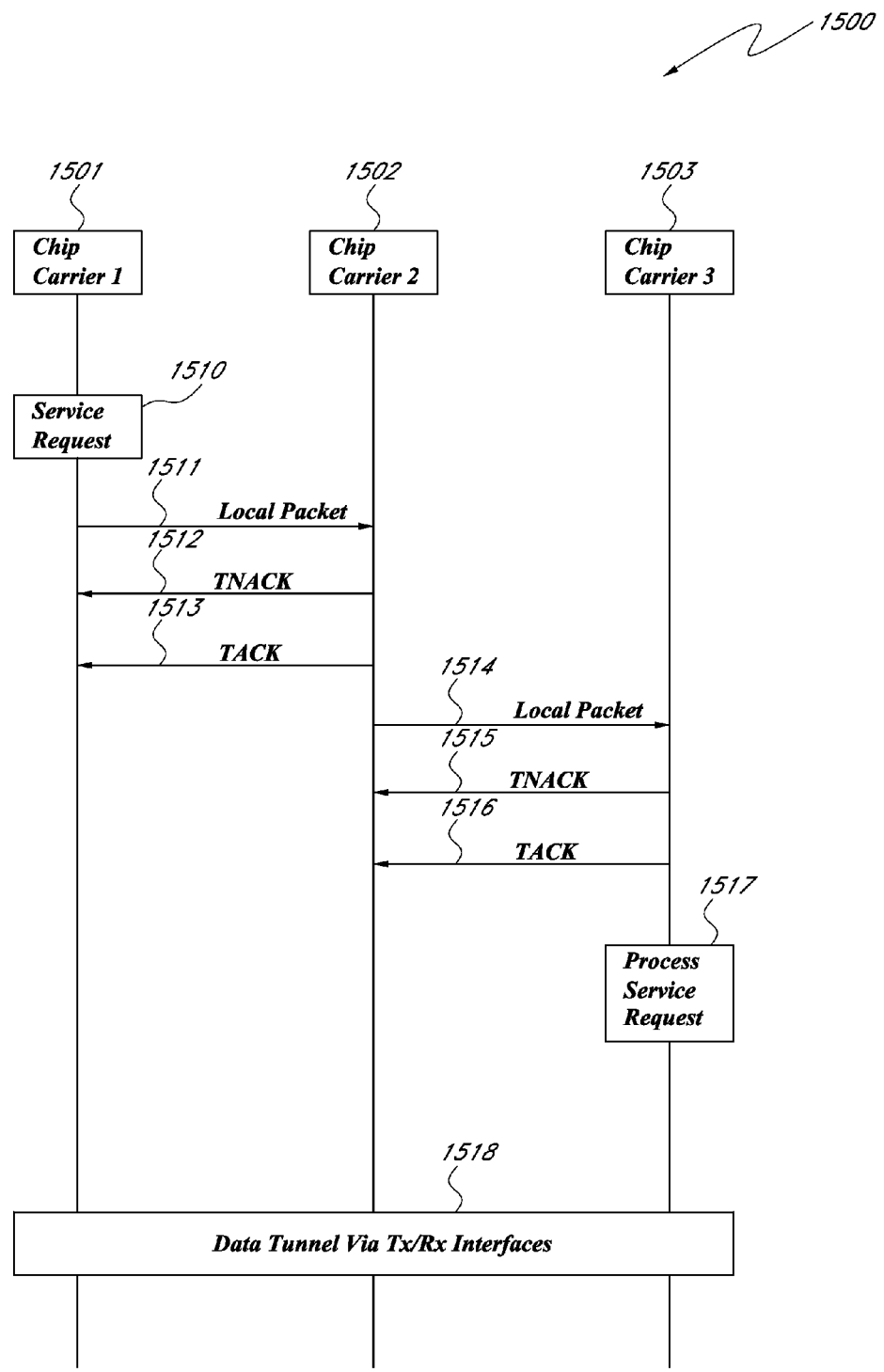
FIG. 15 is a signal flow diagram of one embodiment of a method of distributed computing.

FIG. 15 is a signal flow diagram 1500 of one embodiment of a method of distributed computing. As described above, in one embodiment a chip carrier includes two integrated circuit dice, the two integrated circuit dice are arranged so that they face one another and are in communication with one another. As such, as described herein communication with a dual chip carrier includes communication with one or both of the integrated circuit dice included therein.

Specifically, FIG. 15 depicts signaling to facilitate the establishment of a data tunnel between two chip carriers that each includes one or more integrated circuit dice. A resulting data tunnel may exist between two adjacent chip carriers or between two chip carriers that are separated by one or more other chip carriers. While the signal flow diagram 1500 of FIG. 15 includes only three chip carriers 1501, 1502, 1503, those skilled in the art will appreciate that FIG. 15 is merely an illustrative example. Those skilled in the art will also understand from the present disclosure that any number of chip carriers may be involved with transmitting, processing and responding to a service request and/or transmitting and/or processing data associated with a service request.

Turning to the example illustrated in FIG. 15, as indicated by block 1510, the method includes the first chip carrier 1501 determining and/or generating a service request for the third chip carrier 1503. Given that the third chip carrier 1503 is not an immediate neighbor of the first chip carrier 1501, the service request traverses the communication interface of the second chip carrier 1502. To that end, as indicated signal 1511, the method includes the first chip carrier transmitting a local packet including the service request to the second chip carrier 1502. As indicated by signal 1512, the method includes the second chip carrier 1502 responding to the first chip carrier 1501 by transmitting a "transmission not-acknowledged" (TNACK) message which indicates that the local packet may not have been successfully received. As indicated by signal 1513, if the local packet was successfully received, the method includes the second chip carrier 1502 transmitting a "transmission acknowledged" (TACK) message to the first chip carrier 1501, which negates the automatically transmitted TNACK message. In one embodiment, the first chip carrier 1501 is configured wait for a TACK message after first receiving a TNACK message for a period of time before relying on the TNACK message. In one embodiment, the chip carrier receiving a local packet transmits the TNACK and TACK messages back over the same physical connection that the local packet is received on, thereby freeing other signal pins on both chip carriers to communicate in parallel with the TNACK and TACK messages. In other words, the TNACK and TACK messages are received by the chip carrier that originally transmitted the local packet on a signal pin normally used for transmission. As such, signal pins on that chip carrier that are normally used for receiving signals are free for other communication.

As indicated by signal 1514, the method includes the second chip carrier 1502 transmitting the local packet to the third chip carrier 1503. The second chip carrier 1502 may transmit the local packet before, during or after the second chip carrier transmits the TNACK message and/or the TACK message. Additionally and/or alternatively, the second chip carrier 1502 retransmits portions of the local packet as they are received from the first chip carrier 1501.

As indicated by signal 1515, the method includes the third chip carrier 1503 responding to the second chip carrier 1502 by transmitting a TNACK message which indicates that the local packet may not have been successfully received. As indicated by signal 1516, if the local packet was successfully received, the method includes the third chip carrier 1503 transmitting a "transmission acknowledged" TACK message to the second chip carrier 1502, which negates the automatically transmitted TNACK message. In one embodiment, the second chip carrier 1502 is configured wait for a TACK message after first receiving a TNACK message for a period of time before relying on the TNACK message.

As indicated by block 1517, the method includes the third chip carrier 1503 processing the service request originally sent by the first chip carrier 1501. As indicated by block 1518, the method includes the first and third chip carriers establishing a data tunnel through the second chip carrier 1502. In one embodiment, in instances where the resulting data tunnel includes a path including one or more chip carriers (e.g. the second chip carrier 1502) between the two chip carriers where the data tunnel terminates (e.g. the first and third chip carriers 1501, 1503), the data tunnel is established using the respective communication interfaces of the middle chip carriers without interfering with the primary function of the integrated circuits included on those middle chip carriers. In other words, each respective communication interface substantially routes data away from the primary functional units on the respective integrated dice that do not originate a service request and/or process the service request. As such, only the chip carrier at which a service request originates and the chip carrier in which the service request is processed substantially request, process, access, create and/or consider data traversing the data tunnel. In the example illustrated in FIG. 15, the communication interface of one or more of the dice included in the second chip carrier 1502 routes data away from the primary functional units included in the one or more of the dice, so that the computing operations of those functional units is substantially unaffected.

Figure 16:
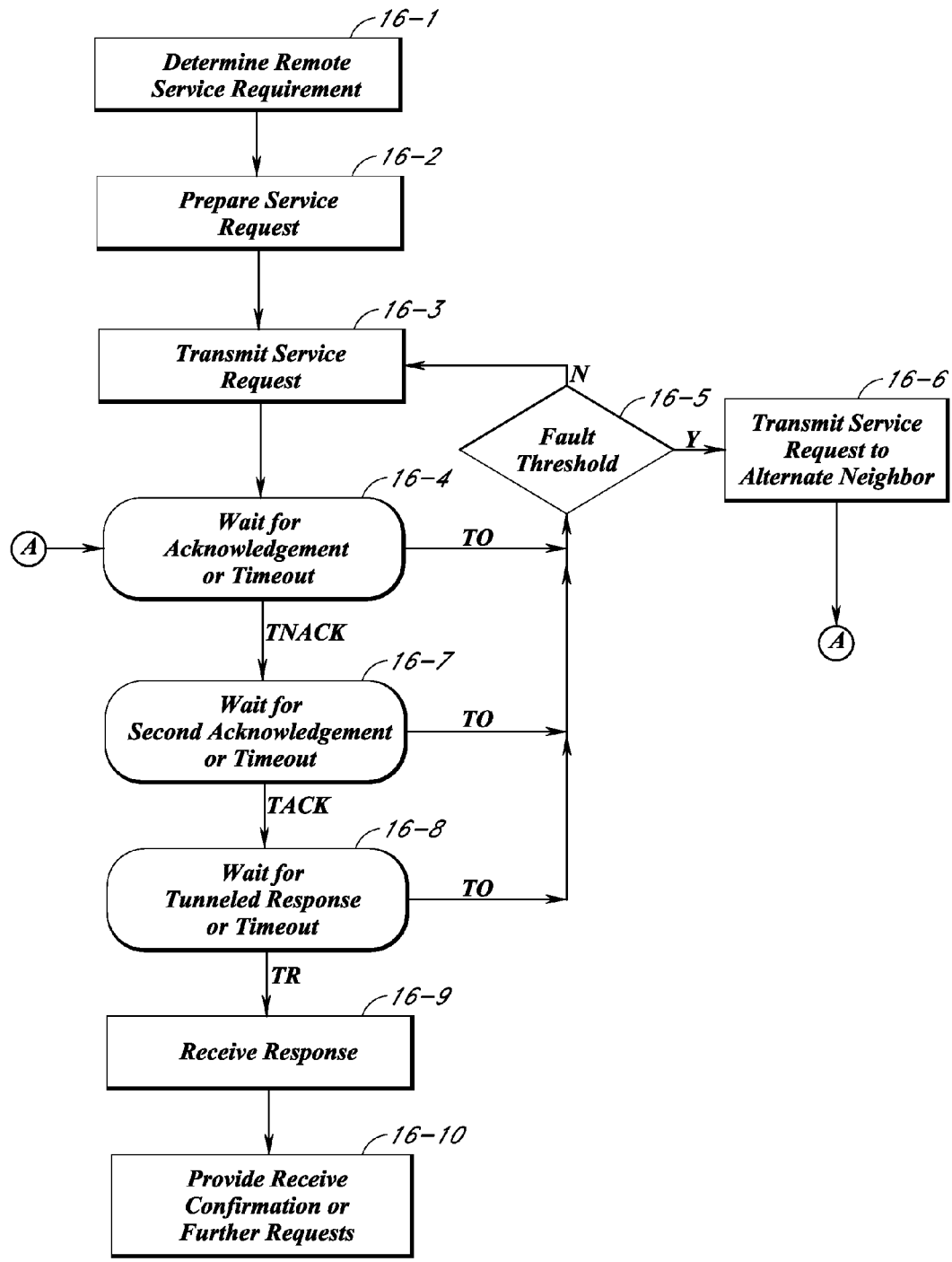
FIG. 16 is a flowchart illustrating one embodiment of a method of distributed computing.

FIG. 16 is a flowchart illustrating one embodiment of a method of distributed computing. The illustrated method can be modified in a variety of ways. For example, in another embodiment, various portions of the illustrated method can be combined, can be rearranged in an alternate sequence, removed, or the like. Specifically, FIG. 16 illustrates a method of requesting remote processing of a service request. For example, with further reference to the signal flow diagram 1500 of FIG. 15, the flowchart of FIG. 16 illustrates one method the first chip carrier 1501 may follow to establish a data tunnel with the third chip carrier 1503. To that end, as represented by block 16-1, the method includes determining a remote service requirement. In other words, an integrated circuit within one chip carrier determines through operation of software and/or firmware that data or service is required from another integrated circuit not located within the same chip carrier. As represented by block 16-2, the method includes preparing a service request. As represented by block 16-3, the method includes transmitting the service request to neighboring chip carrier. As represented by block 16-4, the method includes waiting for an acknowledgement for a first period of time. If an acknowledgement message is not received during the first period (TO path from 16-4), as represented by block 16-5, the method includes determining whether or not a fault threshold has been breached. In one embodiment, a fault threshold is a predetermined number. The predetermined number is representative of times that a service request can be sent to the same neighboring chip carrier without receiving an acknowledgement regarding the reception before the sending chip carrier ceases to transmit service requests to that particular neighboring chip carrier. If the fault threshold has not been breached (No path from 16-5), the method includes looping back to repeat the transmission of the service request as represented by block 16-3. On the other hand, if the fault threshold has been breached (Yes path from 16-5), as represented by block 16-6, the method includes transmitting the service request to an alternate neighboring chip carrier.

Referring again to block 16-4, if a TNACK message is received within the first period of time (TNACK path from 16-4), as represented by block 16-7, the method includes waiting for an acknowledgement for a second period of time. The second period of time can be the same or different than the first period of time discussed above. If an acknowledgement message is not received during the second period (TO path from 16-7), as again represented by block 16-5, the method includes determining whether or not a fault threshold has been breached as discussed above. On the other hand, if a TACK message is received within the second period of time (TACK path from 16-7), as represented by block 16-8, the method includes waiting for a response to the service request for a third period of time. The third period of time may be dynamically set based on the estimated transmission delays and processing time for a particular service request. Additionally and/or alternatively, the third period of time may be a random number or a predetermined fixed number or any other value useful for a particular arrangement of chip carriers.

If a response message is not received during the third period (TO path from 16-8), as again represented by block 16-5, the method includes determining whether or not a fault threshold has been breached as discussed above. On the other hand, if a response message is received within the third period of time (TR path from 16-8), as represented by block 16-9, the method includes receiving a response to the service request through a data tunnel. As represented by block 16-10, the method includes providing confirmation of reception message and/or further service requests over the data tunnel to the servicing chip carrier.

Figure 17:
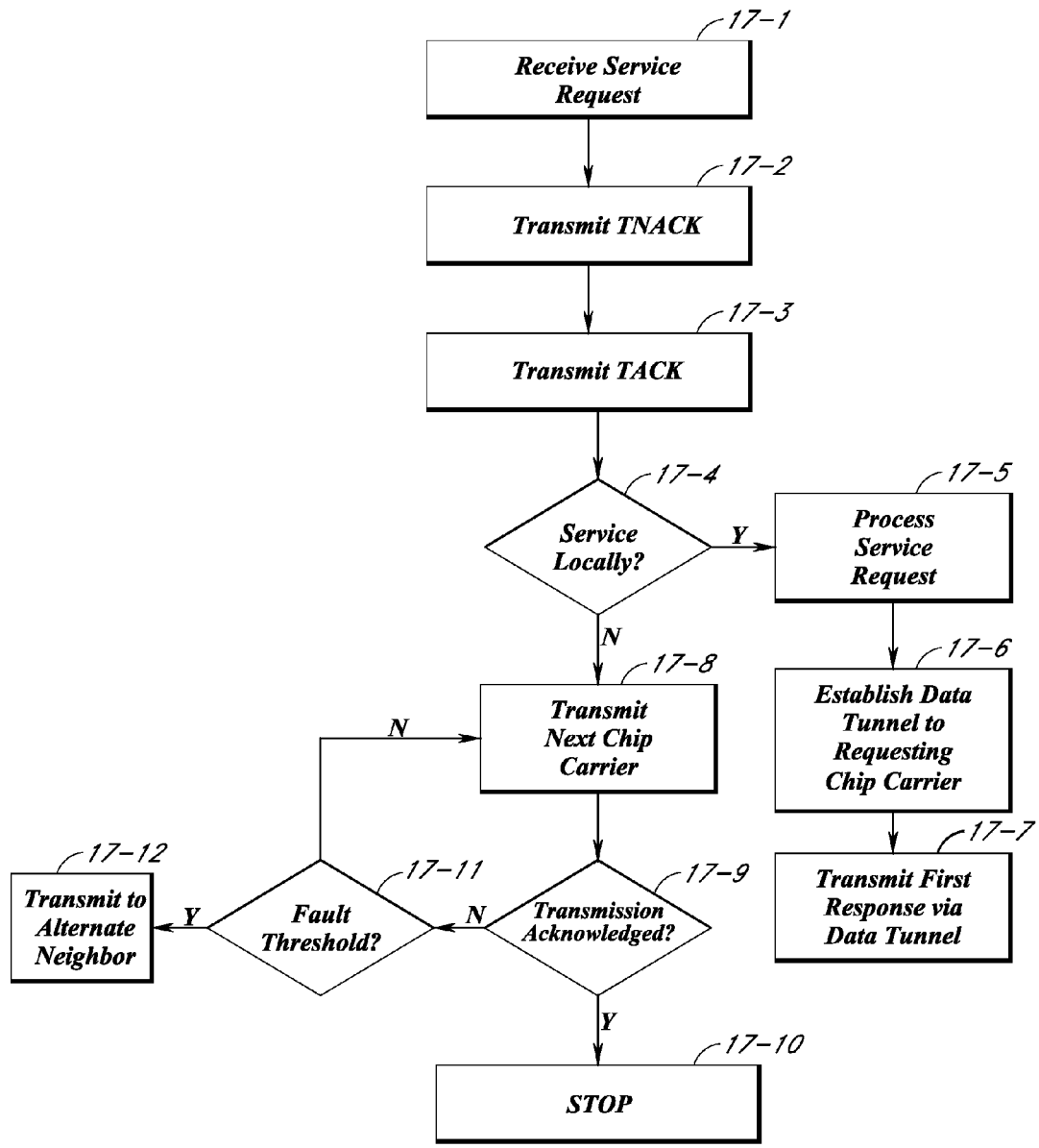
FIG. 17 is a flowchart illustrating one embodiment of a method of distributed computing.

FIG. 17 is a flowchart illustrating one embodiment of a method of distributed computing. The illustrated method can be modified in a variety of ways. For example, in another embodiment, various portions of the illustrated method can be combined, can be rearranged in an alternate sequence, removed, or the like. Specifically, FIG. 17 illustrates a method of receiving and processing a service request. For example, with further reference to the signal flow diagram 1500 of FIG. 15, the flowchart of FIG. 17 illustrates one method the second and third chip carriers 1502, 1503 may follow to establish a data tunnel back to the first chip carrier 1501. To that end, as represented by block 17-1, the method includes receiving a service request within a local packet. As represented by block 17-2, the method includes transmitting a TNACK message in response to receiving the local packet. If the packet was validly received, as represented by block 17-3, the method includes transmitting a TACK message to the chip carrier from which the local packet was received. As represented by block 17-4, the method includes determining whether or not the service request is a request for local service. If it is determined that the service request is a request for local service (Yes path from 17-4), as represented by block 17-5, the method includes processing the service request locally in order to generate a response to the service request. As represented by block 17-6, the method includes establishing a data tunnel back to the requesting chip carrier. In one embodiment, the data tunnel traverses the same path that the service request traversed to the servicing chip carrier. In one embodiment, the data tunnel traverses a shorter and/or more efficient path. As represented by block 17-7, the method includes transmitting a first response over the data tunnel to the requesting chip carrier. In another embodiment, the data tunnel is established before or while the service request is processed locally.

Referring again to block 17-4, on the other hand, if it is determined that the service request is not a request for local service (No path from 17-4), as represented by block 17-8, the method includes transmitting the service request within a local packet to the next chip carrier in the path to the servicing chip carrier. As represented by block 17-9, the method includes determining whether or not a transmission acknowledgement has been received. If a transmission acknowledgement has been received (Yes path from 17-9), as represented by block 17-10 the method concludes. On the other hand, if a transmission acknowledgment has not been received (No path from 17-9), as represented by block 17-11, the method includes determining whether or not a fault threshold has been breached. If the fault threshold has been breached (Yes path from 17-11), as represented by block 17-12 the method includes transmitting the local packet to an alternate neighbor. If the fault threshold has not been breached (No path from 17-11), as represented by block 17-8, the method includes retransmitting the local packet to the same chip carrier.

Figure 18:
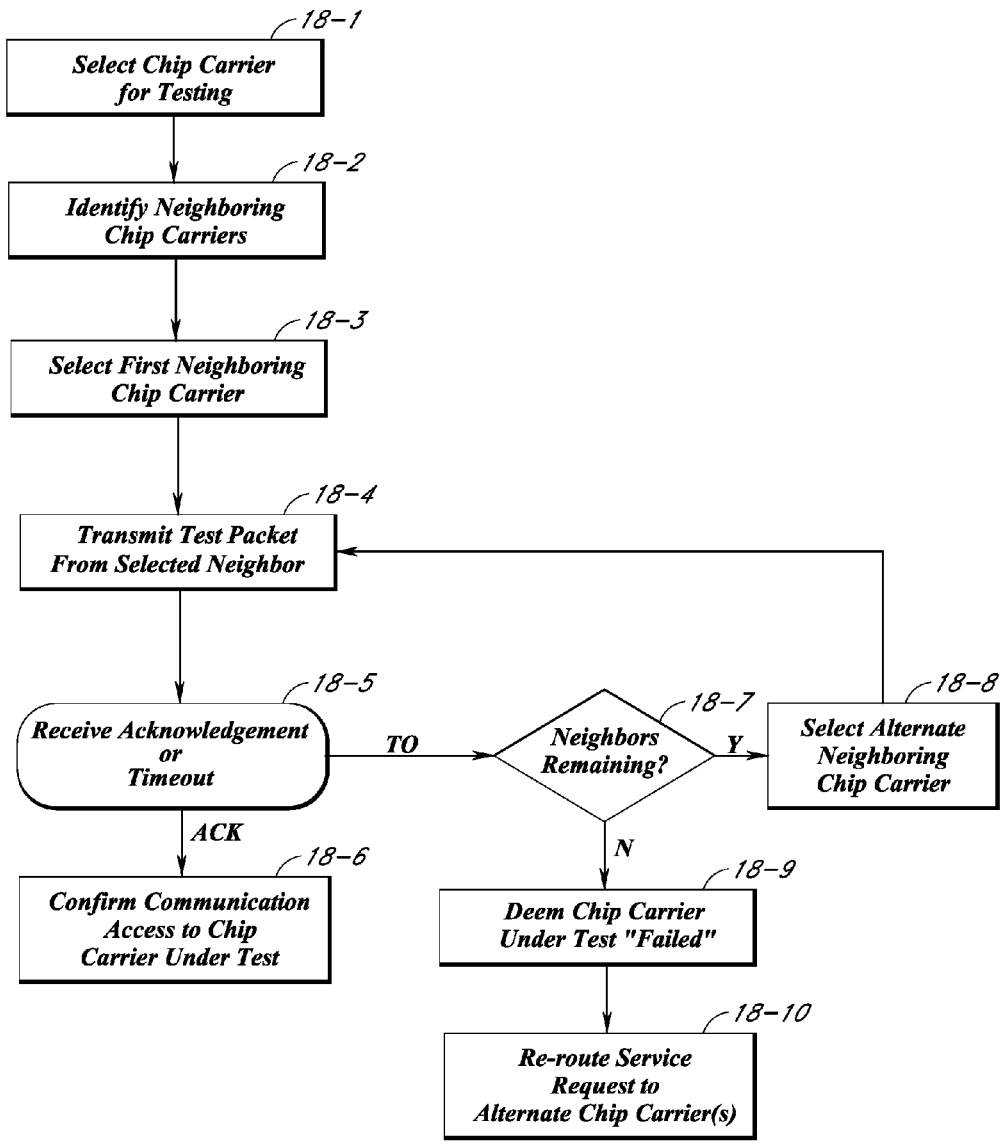
FIG. 18 is a flowchart illustrating one embodiment of a method of distributed computing.

FIG. 18 is a flowchart illustrating one embodiment of a method of distributed computing. The illustrated method can be modified in a variety of ways. For example, in another embodiment, various portions of the illustrated method can be combined, can be rearranged in an alternate sequence, removed, or the like. Specifically, FIG. 18 illustrates a method of testing and dynamically reconfiguring a distributed computing system, such as the system 100 described above with reference to FIGS. 1 and 2. As represented by block 18-1, the method includes selecting a chip carrier for testing. As noted above, a chip carrier as described herein can be configured to house one or two integrated circuit dice. As such, by selecting a chip carrier, one or two separate integrated circuit dice are selected for simultaneous or individual testing depending on the particular configuration of the chip carrier selected. As represented by block 18-2, the method includes identifying neighboring chip carriers of the chip carrier selected for testing. In one embodiment, a subset of the neighboring chip carriers is identified. In one embodiment, all of the neighboring chip carriers are identified. As represented by block 18-3, the method includes selecting a first neighboring chip carrier from which to transmit a test packet.

As represented by block 18-4, the method includes transmitting a test packet (or test vector or the like) from the selected neighbor to the chip carrier under test. As represented by block 18-5, the method includes waiting to receive an acknowledgement for a first duration of time. In one embodiment, for example, the first duration is one of a predetermined duration, a duration randomly determined during operation, a duration determined based on expected processing time of the test packet. Nevertheless, those skilled in the art will appreciate that the first duration can be set in any number of ways and the example provided herein merely illustrate particular possibilities for setting the first duration.

If an acknowledgement is received during the first duration (ACK path from 18-5), as represented by block 18-6, the method includes confirming communication access to the chip carrier under test. Further, in one embodiment, the method further including testing the functionality of the one or two integrated circuit dice included in the chip carrier under test once communication access to the chip carrier has been confirmed. Testing the functionality of a particular internal function module is dependent on the actual functionality of that particular internal function module. Those skilled in the art will appreciate how to conduct such testing for a particular chip once communication access to the chip has been confirmed.

If an acknowledgement is not received during the first duration (TO path from 18-5), as represented by block 18-7, the method includes determining whether or not there are identified neighboring chip carriers that have not yet attempted to transmit a test packet to the chip under test. If there are one or more such neighboring chip carriers (Yes path from 18-7), as represented by block 18-8, the method includes selecting an alternative neighboring chip carrier from the subset of one or more chip carriers that have not yet transmitted a test packet to the chip carrier under test. Further, the method includes looping back to the portion of the method represented by block 18-4 so as to repeat the transmission of the test packet from the newly selected neighboring chip carrier.

Referring again to block 18-7, if there are no more neighboring chip carriers that have yet to transmit a test packet (No path from 18-7), as represented by block 18-9, the method includes deeming the chip carrier under test to be in a failed state because none of the neighbors involved in the testing were able to confirm communication access with the chip carrier under test. As represented by block 18-10, the method includes rerouting service requests and/or functions previously delegated to the chip carrier under test to alternate chip carriers where possible. In one embodiment, rerouting service requests and/or functions includes computer software that distributes service requests and/or delegates functions to operable chip carriers, taking into account the loss of capacity of chip carriers that are currently deemed to be in a failed state.

Figure 19:
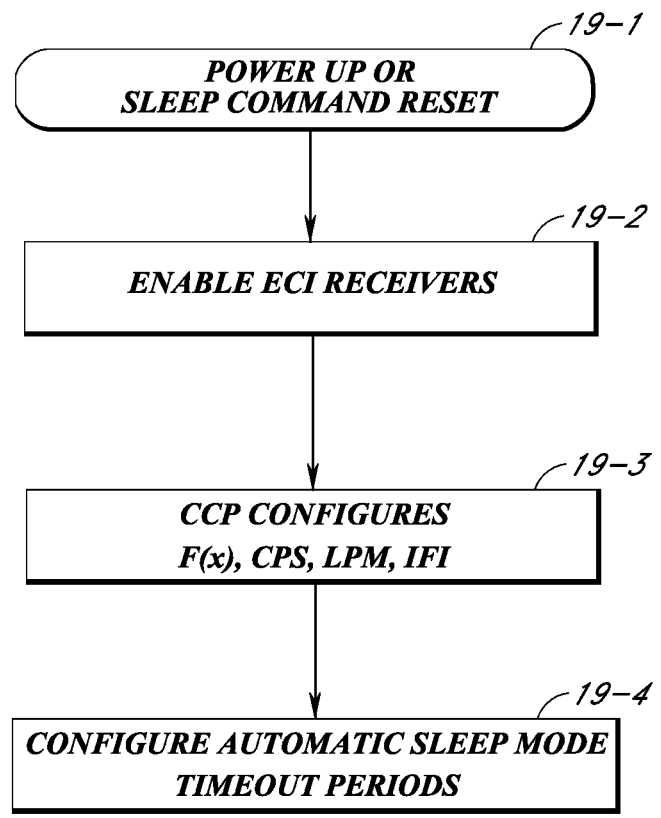
FIG. 19 is a flowchart illustrating one embodiment of a method of shifting to a sleep mode of operation in a distributed computing system.

FIG. 19 is a flowchart illustrating one embodiment of a method of shifting to a sleep mode of operation in a distributed computing system. The illustrated method can be modified in a variety of ways. For example, in another embodiment, various portions of the illustrated method can be combined, can be rearranged in an alternate sequence, removed, or the like. Specifically, FIG. 19 illustrates a method of initializing a sleep mode operation. As represented by block 19-1, the method includes at least one of powering up an internal function module (referenced as F(X) in FIGS. 19-23) and resetting a sleep command flag internal to the internal function module. As represented by block 19-2, the method includes enabling external communications interface (ECI) receivers. In one embodiment, ECI receivers are assumed to be in active state so long as the chip receives power. As represented by block 19-3, the method includes a configuration control process (CCP) configuring an internal function module, an associated cross-point switch (CPS), an associated local private memory (LPM), and an associated internal function interface (IFI). As represented by block 19-4, the method includes configuring automatic sleep mode timeout periods. Examples of sleep mode timeout periods are discussed in further detail below with reference to FIG. 22.

Figure 20:
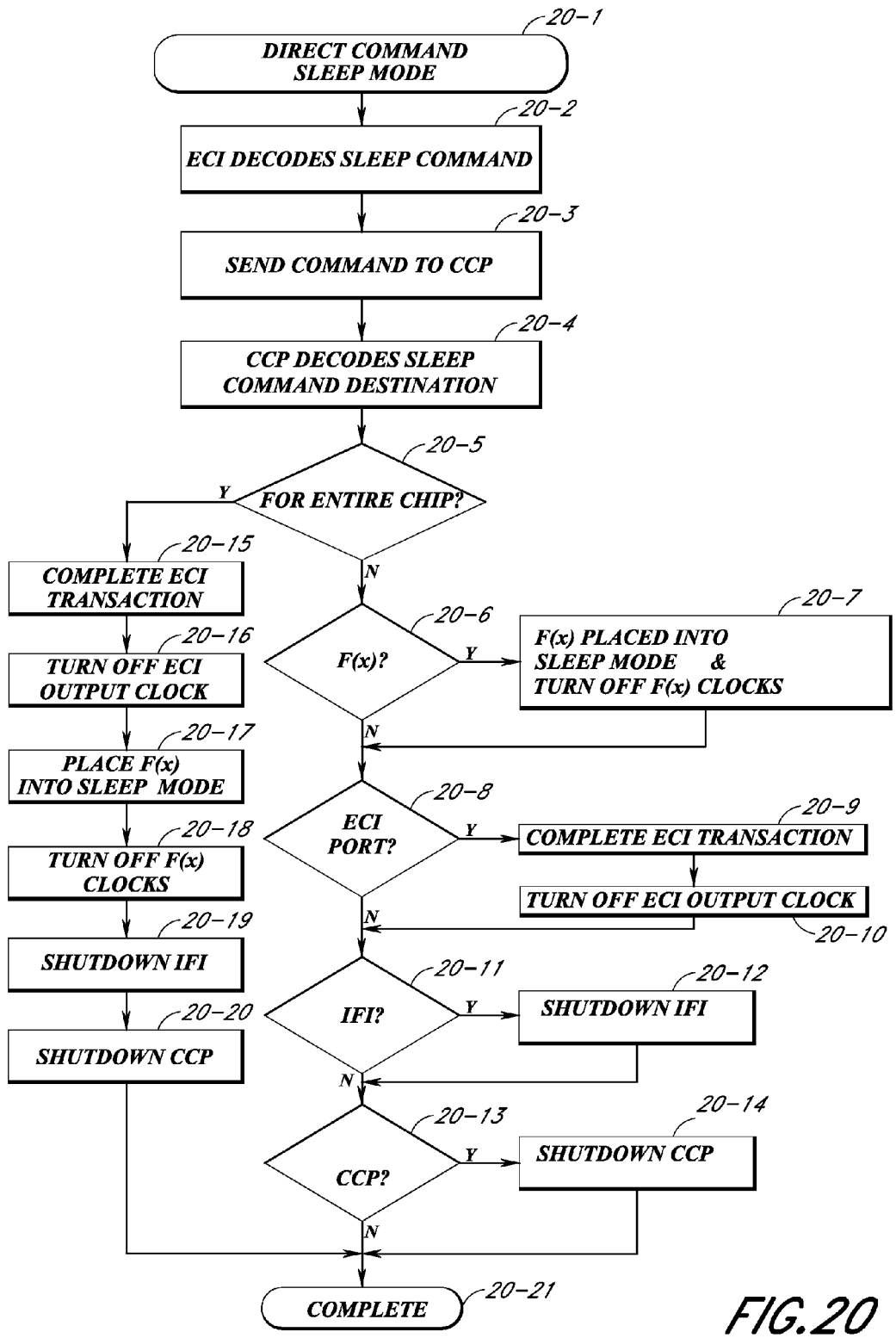
FIG. 20 is a flowchart illustrating one embodiment of a method of shifting to a sleep mode of operation in a distributed computing system.

FIG. 20 is a flowchart illustrating one embodiment of a method of shifting to a sleep mode of operation in a distributed computing system. The illustrated method can be modified in a variety of ways. For example, in another embodiment, various portions of the illustrated method can be combined, can be rearranged in an alternate sequence, removed, or the like. In one embodiment, the method responds to an instruction that signals an orderly completion of some or all transactions of modules included on a chip so that one or more of the modules can safely enter an idle state. Specifically, FIG. 20 illustrates a method of directing an internal function module into a sleep mode of operation. As represented by block 20-1, the method includes providing an internal function module with a command to enter a sleep mode of operation. As represented by block 20-2, the method includes an ECI decoding the sleep mode command. As represented by block 20-3, the method includes sending the decoded command to a CCP. As represented by block 20-4, the method includes the CCP decoding the sleep mode command destination. As represented by block 20-5, the method includes determining whether or not the sleep mode command is applicable to the entire chip or merely a subset of particular modules included on the chip.

If the sleep mode command is applicable to the entire chip (Yes path from 20-5), as represented by block 20-15, the method includes completing the ECI transaction. That is, each ECI port is directed to enter sleep mode by the CCP. In one embodiment, the command originates from a different ECI port than the particular ECI port directed into the sleep mode. In another embodiment, the command originates from the same ECI port directed to enter sleep mode or even the CCP itself. By completing the transaction on a particular ECI port directed to enter sleep mode both ends of the transaction complete in a normal manner. On the other hand, if a ECI port immediately entered the sleep mode the transaction would have been truncated and an error would be indicated and/or induced on the communicating partner of the ECI port.

As represented by block 20-16, the method includes turning off the ECI output clock. As represented by block 20-17, the method includes placing the internal function module F(X) into sleep mode. As represented by block 20-18, the method includes deactivating the internal function module clocks. As represented by block 20-19, the method includes shutting down the IFI. As represented by block 20-20, the method includes shutting down the CCP. In one embodiment, the various components discussed above are shutdown in the order presented herein. However, those skilled in the art will appreciate that the order presented is merely one example of the order in which various components on a chip can be placed into sleep mode.

Referring again to block 20-5, if the sleep mode command is not applicable to the entire chip (No path from 20-5), as represented by blocks 20-6 through 20-14, the method includes determining which modules the sleep command is applicable to and shutting down those modules. For example, as represented by block 20-6, the method includes determining whether or not the sleep command is applicable to the internal function module F(X). If the sleep command is applicable to the internal function module (Yes path from 20-6), as represented by block 20-7, the method includes placing the internal function module into sleep mode and turning off the internal function module clocks. As represented by block 20-8, the method includes determining whether or not the sleep command is applicable to the ECI port. If the sleep command is applicable to the ECI port (Yes path from 20-8), as represented by blocks 20-9 and 20-10, the method includes completing the ECI transaction and turning off the ECI output clock. As represented by block 20-11, the method includes determining whether or not the sleep command is applicable to the IFI. If the sleep command is applicable to the IFI (Yes path from 20-11), as represented by block 20-12, the method includes shutting down the IFI. As represented by block 20-13, the method includes determining whether or not the sleep command is applicable to the CCP. If the sleep command is applicable to the CCP (Yes path from 20-13), as represented by block 20-14, the method includes shutting down the CCP. As represented by block 20-21, after processing the portions of the method discussed above, the method includes providing an indication that the sleep mode of operation has been entered as directed.

Figure 21:
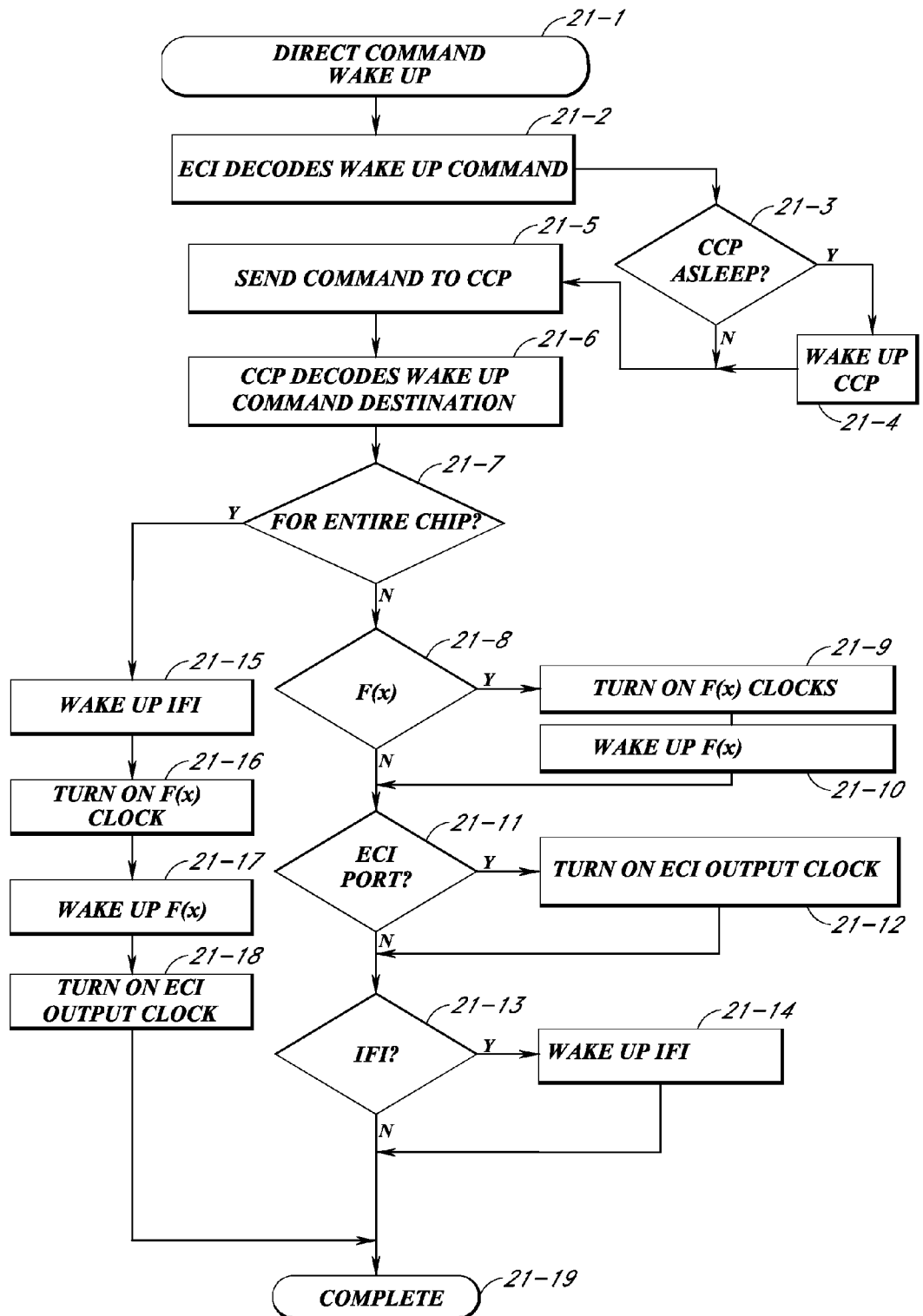
FIG. 21 is a flowchart illustrating one embodiment of a method of reactivating an integrated circuit in a sleep mode of operation in a distributing computing system.

FIG. 21 is a flowchart illustrating one embodiment of a method of reactivating an integrated circuit in a sleep mode of operation in a distributing computing system. The illustrated method can be modified in a variety of ways. For example, in another embodiment, various portions of the illustrated method can be combined, can be rearranged in an alternate sequence, removed, or the like. Specifically, FIG. 21 illustrates a method of directing a chip die into an active mode of operation that is wholly or partially in a sleep mode of operation. As represented by block 21-1, the method includes providing a chip with a command to exit the sleep mode of operation. As represented by block 21-2, the method includes an ECI decoding the command. As represented by block 21-3, the method includes determining whether the CCP is in a sleep mode of operation. If the CCP is currently in a sleep mode (Yes path from 21-3), as represented by block 21-4, the method includes reactivating the CCP. On the other hand, if the CCP is already active (No path from 21-3), as represented by block 21-5, the method includes sending the decoded command to a CCP. As represented by block 21-6, the method includes the CCP decoding the command destination(s). As represented by block 21-7, the method includes determining whether or not the command is applicable to the entire chip or merely a subset of particular modules included on the chip.

If the command is applicable to the entire chip (Yes path from 21-7), as represented by block 21-15, the method includes activating the IFI. As represented by block 21-16, the method includes activating the internal function module clock. As represented by block 21-17, the method includes activating the internal function module. As represented by block 21-18, the method includes activating the ECI output clock. In one embodiment, the various components discussed above are activated in the order presented herein. However, those skilled in the art will appreciate that the order presented is merely one example of the order in which various components on a chip can be reactivated from a sleep mode of operation.

Referring again to block 21-7, if the command is not applicable to the entire chip (No path from 21-7), as represented by blocks 21-8 through 21-14, the method includes determining which modules the command is applicable to and activating those modules. For example, as represented by block 21-8, the method includes determining whether or not the command is applicable to the internal function module. If the command is applicable to the internal function module (Yes path from 21-8), as represented by blocks 21-9 and 21-10, the method includes reactivating the internal function module clocks and the internal function module. As represented by block 21-11, the method includes determining whether or not the command is applicable to the ECI port. If the command is applicable to the ECI port (Yes path from 21-11), as represented by blocks 21-12, the method includes activating the ECI output clock. As represented by block 21-13, the method includes determining whether or not the command is applicable to the IFI. If the command is applicable to the IFI (Yes path from 21-13), as represented by block 21-14, the method includes activating the IFI. As represented by block 21-19 after processing the portions of the method discussed above, the method includes providing an indication that the sleep mode of operation has been exited as directed.

Figure 22:
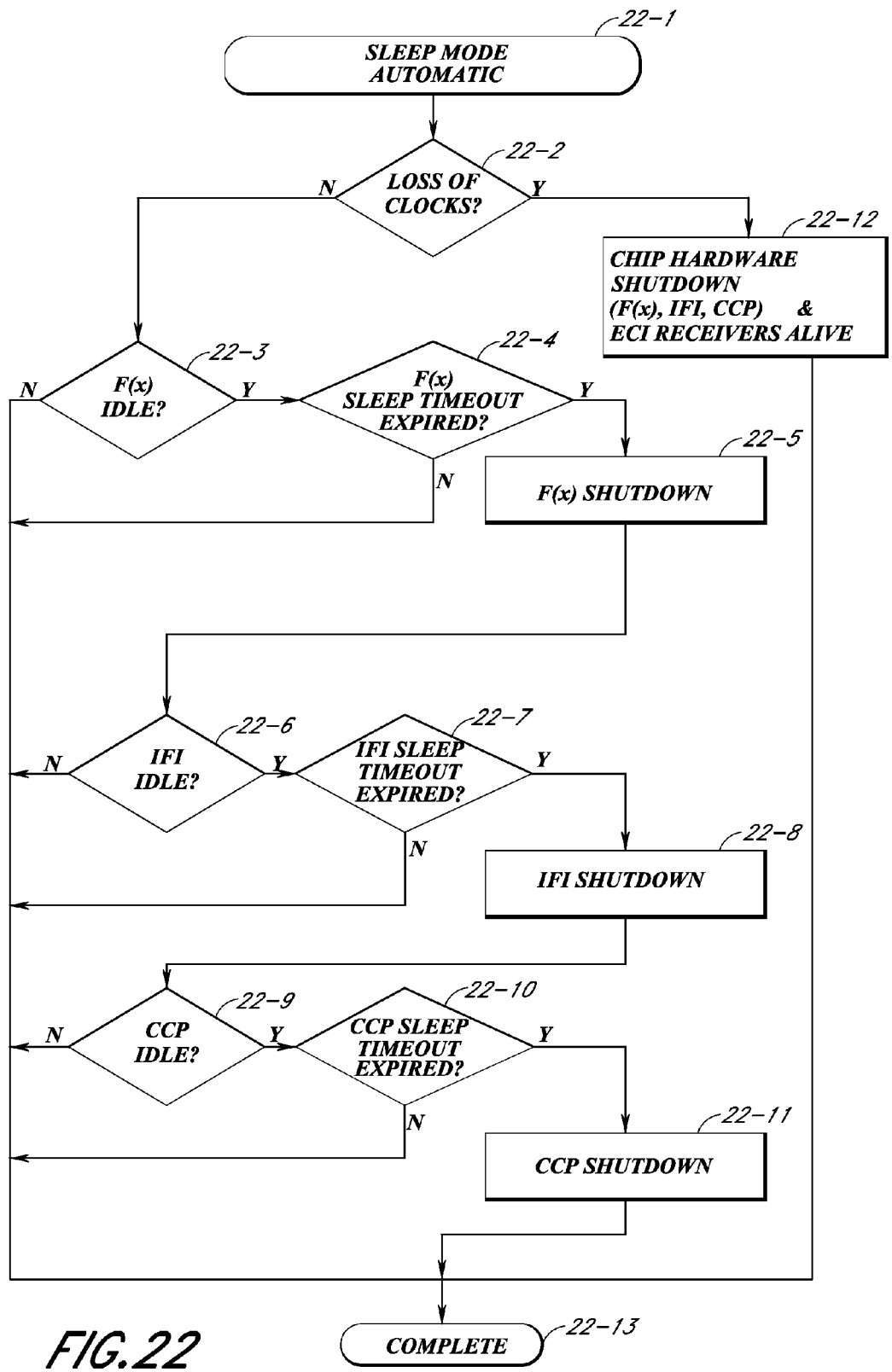
FIG. 22 is a flowchart illustrating one embodiment of a method of shifting to a sleep mode of operation in a distributed computing system.

FIG. 22 is a flowchart illustrating one embodiment of a method of shifting to a sleep mode of operation in a distributed computing system. The illustrated method can be modified in a variety of ways. For example, in another embodiment, various portions of the illustrated method can be combined, can be rearranged in an alternate sequence, removed, or the like. Specifically, FIG. 22 illustrates a method enabling a chip to sense conditions indicative of lower activity and automatically and autonomously enter a sleep mode of operation. In one embodiment, when one or more clock signals provided to a chip become unavailable the chip responds by transitioning into a reset state and powers down one or more functional blocks with the possible exception of the ECI receivers. In one embodiment, even in a sleep mode of operation, the LPM and internal function module are provided with a keep-alive power supply in order to retain information stored in volatile memory. As represented by block 22-1, the method includes configuring an automatic sleep mode sensing scheme. As represented by block 22-2, the method includes determining whether externally provided clocks are no longer available. If it is determined that the external clocks are no longer available (Yes path from 22-2), as represented by block 22-12, the method includes automatically deactivating a number of modules included on a chip, but maintaining active operation of the ECI receivers.

On the other hand, if the external clocks are available (No path from 22-2), as represented by block 22-3 through 22-11, the method includes determining which modules have a sufficiently low level of activity for a sufficiently long enough period of time to justify placing the modules individually into a sleep mode of operation. For example, as represented by block 22-3, the method includes determining whether or not the internal function module is idle. If the internal function module is not idle (No path from 22-3), in one embodiment it is assumed that entering a sleep mode of operation would be disruptive to ongoing computing by the chip. As such, as indicated by block 22-13, the method terminates. On the other hand, if the internal function module is idle (Yes path from 22-3), as represented by block 22-4, the method includes determining if a internal function module sleep timer has expired, indicating that the internal function module has been idle for at least as long as the initial value of the timer. If the timer has not expired (No path from 22-4), as represented by block 22-13, the method terminates. If the timer has expired (Yes path from 22-4), as represented by block 22-5, the method includes deactivating the idle internal function module.

As represented by block 22-6, the method includes determining whether or not the IFI is idle. If the IFI is not idle (No path from 22-6), in one embodiment it is assumed that entering a sleep mode of operation would be disruptive to ongoing computing by the chip. As such, as indicated by block 22-13, the method terminates. On the other hand, if the IFI is idle (Yes path from 22-6), as represented by block 22-7, the method includes determining if an IFI sleep timer has expired, indicating that the IFI has been idle for at least as long as the initial value of the timer. If the timer has not expired (No path from 22-7), as represented by block 22-13, the method terminates. If the timer has expired (Yes path from 22-7), as represented by block 22-8, the method includes deactivating the idle IFI.

As represented by block 22-9, the method includes determining whether or not the CCP is idle. If the CCP is not idle (No path from 22-9), in one embodiment it is assumed that entering a sleep mode of operation would be disruptive to ongoing computing by the chip. As such, as indicated by block 22-13, the method terminates. On the other hand, if the CCP is idle (Yes path from 22-9), as represented by block 22-10, the method includes determining if a CCP sleep timer has expired, indicating that the CCP has been idle for at least as long as the initial value of the timer. If the timer has not expired (No path from 22-10), as represented by block 22-13, the method terminates. If the timer has expired (Yes path from 22-10), as represented by block 22-11, the method includes deactivating the idle CCP. And as represented by block 22-13, the method terminates.

Figure 23:
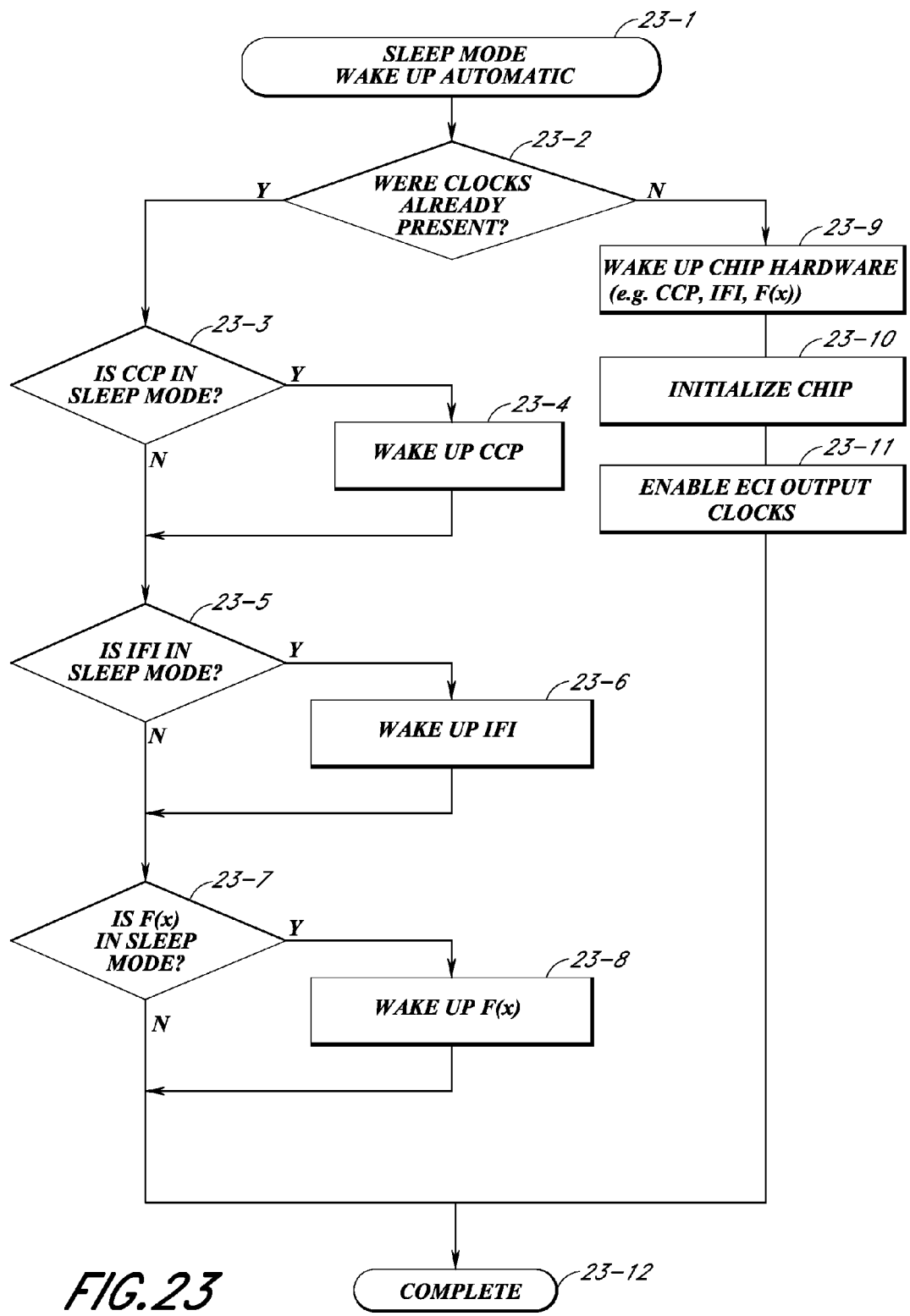
FIG. 23 is a flowchart illustrating one embodiment of a method of reactivating an integrated circuit in a sleep mode of operation in a distributing computing system.

FIG. 23 is a flowchart illustrating one embodiment of a method of reactivating an integrated circuit in a sleep mode of operation in a distributing computing system. The illustrated method can be modified in a variety of ways. For example, in another embodiment, various portions of the illustrated method can be combined, can be rearranged in an alternate sequence, removed, or the like. Specifically, FIG. 23 illustrates a method of enabling a chip to sense conditions indicative of higher activity and automatically and autonomously exit a sleep mode of operation into an active state. In one embodiment, a chip is configured to sense and respond to a clock signal in accordance with one of three configurations. In a first configuration, the ECI and CPS are reactivated and other elements remain in a sleep mode of operation. In this configuration, the ECI and CPS have the ability to pass transmission from a device to another device as in a normal operation but without intervention by the CCP or the internal function module. In a second configuration, substantially the on-chip elements are reactivated except for the IFI and the internal functional module. In this configuration transmission test and test of the dual interface may be performed by a reactivation command of the IFI to test the operation and integrity of the IFI. In a third configuration, the entire chip is fully activated.

As represented by block 23-1, the method includes configuring an automatic sleep mode reactivation sensing scheme. As represented by block 23-2, the method includes determining whether available externally provided clocks were previously available. If it is determined that the external clocks were not previously available (No path from 23-2), as represented by block 23-9, the method includes automatically reactivating a number of modules included on a chip that were previously placed into a sleep mode of operation. As represented by block 23-10, the method includes initializing the reactivated modules on the chip. In one embodiment, initializing the reactivated modules on the chip includes setting the all the modules on the chip with predetermined values and/or biasing the modules to particular operating points. As represented by block 23-11, the method includes enabling the ECI output clocks.

Referring again to block 23-2, if the external clocks were available (Yes path from 23-2), as represented by block 23-3 through 22-8, the method includes determining which modules are in sleep mode and reactivating those modules. For example, as represented by block 23-3, the method includes determining whether or not the CCP is in sleep mode. If the CCP is in sleep mode (Yes path from 23-3), as represented by block 23-4, the method includes reactivating the CCP. As represented by block 23-5, the method includes determining whether or not the IFI is in sleep mode. If the IFI is in sleep mode (Yes path from 23-5), as represented by block 23-6, the method includes reactivating the IFI. As represented by block 23-7, the method includes determining whether or not the internal function module is in sleep mode. If the internal function module is in sleep mode (Yes path from 23-7), as represented by block 23-8, the method includes reactivating the internal function module. In one embodiment, the various components discussed above are activated in the order presented herein. However, those skilled in the art will appreciate that the order presented is merely one example of the order in which various components on a chip can be reactivated from a sleep mode of operation.

The above description is provided to enable any person skilled in the art to make or use embodiments within the scope of the appended claims. Various modifications to these aspects will be readily apparent to those skilled in the art, and the generic principles defined herein may be applied to other aspects without departing from the scope of the disclosure. Thus, the present disclosure is not intended to be limited to the aspects shown herein but is to be accorded the widest scope consistent with the principles and novel features disclosed herein.

For example, a skilled artisan will recognize from the present disclosure that various methods of manufacture, design, and materials can be used to make the various components described herein. Additionally, other combinations, omissions, substitutions and modifications will be apparent to the skilled artisan in view of the disclosure herein. It is contemplated that various aspects and features of the invention described can be practiced separately, combined together, or substituted for one another, and that a variety of combination and sub-combinations of the features and aspects can be made and still fall within the scope of the invention. Furthermore, the systems described above need not include all of the modules and functions described in the preferred embodiments. Accordingly, the present invention is not intended to be limited by the recitation of the preferred embodiments, but is to be defined by reference to the appended claims.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that any of the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

What is claimed is:

1. An apparatus comprising:
   a chip carrier comprising a package cap and a package base, wherein the chip carrier houses integrated circuit dice arranged facing one another;
   a first integrated circuit die disposed within the chip carrier, the first die having:
      a surface with first electrical connections to electronic circuitry within the first integrated circuit die facing away from the package cap;
      a base of the first integrated circuit die facing towards the package cap; and
      edges,
      wherein the first electrical connections comprise a first set of one or more connection pads, and wherein each connection pad enables at least one of communication to or from the first die;
   a second integrated circuit die disposed within the chip carrier, the second die having:
      a surface with second electrical connections to electronic circuitry within the second integrated circuit die facing away from the package base;
      a base of the second integrated circuit die facing towards the package base; and
      edges,
      wherein the second electrical connections comprise a second set of one or more connection pads, wherein each connection pad enables at least one of communication to or from the second die, and wherein the surface of the second die including the second set of one or more connection pads is arranged to face the surface of the first die including the first set of one or more connection pads; and
   a first solder ball coupling at least one connection pad of the first set of one or more connection pads to one or more corresponding connection pads of the second set of one or more connection pads.

2. The apparatus of claim 1, wherein the first solder ball provides at least one of a serial data interface between the first die and the second die or a parallel data interface between the first die and the second die.

3. The apparatus of claim 1, further comprising:
   a third set of one or more connection pads on the surface of the first die, wherein each connection pad enables one of communication to and from the first die;
   a fourth set of one or more connection pads on the surface of the second die, wherein each connection pad enables at least one of communication to or from the second die; and
   a second solder ball coupling at least one connection pad of the third set of one or more connection pads to one or more corresponding connection pads of the fourth set of one or more connection pads.

4. The apparatus of claim 3, wherein the first solder ball provides a serial data interface between the first die and the second die, and the second solder ball provides a parallel data interface between the first and the second die.

5. The apparatus of claim 1, further comprising:
   a third integrated circuit die, the third die having a surface comprising a third set of one or more connection pads, wherein each connection pad enables at least one of communication to and from the third die, wherein the third die is adjacent the first die and disposed facing substantially the same direction as the first die;
   a second solder ball coupling at least one connection pad of the third set of one or more connection pads to one or more corresponding connection pads of the first set of one or more connection pads.

6. The apparatus of claim 1, further comprising:
   a third integrated circuit die, the third die having a surface comprising a third set of one or more connection pads, wherein each connection pad enables at least one of communication to and from the third die, wherein the third die is adjacent the first die;
   a fourth integrated circuit die, the fourth die having a surface comprising a fourth set of one or more connection pads, wherein each connection pad enables at least one of communication to and from the fourth die, wherein the fourth die is adjacent the second die and wherein the surface of the fourth die including the fourth set of one or more connection pads is arranged to face the surface of the third die including the third set of one or more connection pads; and
   a second solder ball coupling at least one connection pad of the third set of one or more connection pads to one or more corresponding connection pads of the fourth set of one or more connection pads.

7. The apparatus of claim 6, further comprising:
   a fifth set of one or more connection pads on the surface of the first die, wherein each connection pad enables at least one of communication to and from the first die;
   a sixth set of one or more connection pads on the surface of the third die, wherein each connection pad enables at least one of communication to and from the third die; and
   a third solder ball coupling at least one connection pad of the fifth set of one or more connection pads to one or more corresponding connection pads of the sixth set of one or more connection pads.

8. The apparatus of claim 7, wherein the third solder ball provides at least one of a serial data interface between the first die and the third die or a parallel data interface between the first die and the third die.

9. The apparatus of claim 6, further comprising:
a fifth set of one or more connection pads on the surface of the second die, wherein each connection pad enables at least one of communication to and from the second die;
a sixth set of one or more connection pads on the surface of the fourth die, wherein each connection pad enables at least one of communication to and from the fourth die; and
a third solder ball coupling at least one connection pad of the fifth set of one or more connection pads to one or more corresponding connection pads of the sixth set of one or more connection pads.

10. The apparatus of claim 9, wherein the third solder ball provides at least one of a serial data interface between the second die and the fourth die or a parallel data interface between the second die and the fourth die.

11. The apparatus of claim 6, further comprising:
a fifth set of one or more connection pads on the surface of the first die, wherein each connection pad enables at least one of communication to or from the first die;
a sixth set of one or more connection pads on the surface of the third die, wherein each connection pad enables at least one of communication to or from the third die; and
a seventh set of one or more connection pads on the surface of the second die, wherein each connection pad enables at least one of communication to or from the second die;
a eighth set of one or more connection pads on the surface of the fourth die, wherein each connection pad enables at least one of communication to or from the fourth die;
a third solder ball coupling at least one connection pad of the fifth set of one or more connection pads to one or more corresponding connection pads of the sixth set of one or more connection pads; and
a fourth solder ball coupling at least one connection pad of the seventh set of one or more connection pads to one or more corresponding connection pads of the eighth set of one or more connection pads.

12. The apparatus of claim 11, wherein the third solder ball provides at least one of a serial data interface between the first die and the third die or a parallel data interface between the first die and the third die, and the fourth solder ball provides at least one of a serial data interface between the second die and the fourth die or a parallel data interface between the second die and the fourth die.

13. The apparatus of claim 1, wherein the first die comprises an integrated circuit with an internal function module F(X).

14. The apparatus of claim 13, wherein the first die comprises an external interface.

15. The apparatus of claim 14, wherein the external interface is an input-output interface operable with other devices.

16. The apparatus of claim 14, wherein the first die further comprises:
an internal interface connected to the internal function module F(X); and
an interface translator coupled between the external interface and the internal interface, the interface translator bridging communication between the external interface and the internal interface.

17. The apparatus of claim 6, wherein the first die communicates with the fourth die via a data path including at least one of the second die or the third die.

18. The apparatus of claim 6, wherein the second die communicates with the third die via a data path including at least one of the first die or the fourth die.

19. The apparatus of claim 11, wherein the third solder ball is electrically connected to a first die flying connection and the fourth solder ball is electrically connected to a second die flying connection.

20. The apparatus of claim 6, further comprising a first layer of integrated circuit dice facing a second layer of integrated circuit dice, wherein the first layer comprises the first integrated circuit die and the third integrated circuit die, and wherein the second layer comprises the second integrated circuit die and the fourth integrated circuit die.

21. The apparatus of claim 16, wherein the internal interface is connected to the internal function module F(X) via one or more parallel buses.

22. The apparatus of claim 1, wherein the apparatus changes from a first communication state to a second communication state different from the first communication state by reconfiguring electrical connections within the apparatus.

23. The apparatus of claim 19, further comprising:
a fifth solder ball electrically connected between the first die flying connection and a third die flying connection; and
a sixth solder ball electrically connected between the second die flying connection and a fourth die flying connection.

24. The apparatus of claim 23, further comprising:
a seventh solder ball electrically connected between the third die flying connection and the third die; and
an eighth solder ball electrically connected between the fourth die flying connection and the fourth die.

25. The apparatus of claim 6, further comprising a second chip carrier housing the third integrated circuit die and the fourth integrated circuit die.

* * * * *